(12) United States Patent
Lee et al.

(10) Patent No.: US 8,059,469 B2
(45) Date of Patent: Nov. 15, 2011

(54) SEMICONDUCTOR DEVICE INCLUDING DRIVING TRANSISTORS

(75) Inventors: Se-Hoon Lee, Yongin-si (KR);
Choong-Ho Lee, Yongin-si (KR);
Jeong-Dong Choe, Anyang-si (KR);
Tae-Yong Kim, Osan-si (KR);
Woo-Jung Kim, Seoul (KR);
Dong-Hoon Jang, Seoul (KR);
Young-Bae Yoon, Yongin-si (KR);
Ki-Hyun Kim, Hwaseong-si (KR);
Min-Tai Yu, Seoul (KR)

(73) Assignee: Samsung Electronics Co., Ltd. (KR)

( * ) Notice: Subject to any disclaimer, the term of this patent is extended or adjusted under 35 U.S.C. 154(b) by 378 days.

(21) Appl. No.: 12/481,916

(22) Filed: Jun. 10, 2009

(65) Prior Publication Data

US 2010/0008152 A1    Jan. 14, 2010

(30) Foreign Application Priority Data

Jul. 11, 2008 (KR) ........................ 10-2008-0067702

(51) Int. Cl.
*G11C 11/34* (2006.01)

(52) U.S. Cl. .............................. 365/185.23; 365/230.06

(58) Field of Classification Search ............. 365/185.23, 365/230.06
See application file for complete search history.

(56) References Cited

U.S. PATENT DOCUMENTS

| | | | |
|---|---|---|---|
| 5,276,652 A * | 1/1994 | Anami | ........................ 365/227 |
| 6,972,996 B2 | 12/2005 | Hosono et al. | |
| 7,057,915 B2 | 6/2006 | Futatsuyama | |
| 7,177,173 B2 | 2/2007 | Futatsuyama | |
| 2005/0018462 A1 | 1/2005 | Hosono et al. | |
| 2005/0141284 A1 | 6/2005 | Futatsuyama | |
| 2006/0187737 A1 | 8/2006 | Futatsuyama | |

FOREIGN PATENT DOCUMENTS

| | | |
|---|---|---|
| JP | 9-82923 | 3/1997 |
| KR | 10-0579026 | 5/2006 |
| KR | 10-2007-0021758 | 2/2007 |

\* cited by examiner

*Primary Examiner* — Jason Lappas
(74) *Attorney, Agent, or Firm* — Onello & Mello, LLP

(57) ABSTRACT

A semiconductor device includes a driving active region defined in a substrate and at least three driving transistors disposed at the driving active region. The driving transistors share one common source/drain, and each of the driving transistors includes individual source/drains being independent from each other. The common source/drain and the individual source/drains are disposed in the driving active region.

25 Claims, 19 Drawing Sheets

SEMICONDUCTOR DEVICE INCLUDING DRIVING TRANSISTORS

CROSS-REFERENCE TO RELATED APPLICATIONS

This U.S. non-provisional patent application claims priority under 35 U.S.C. §119 of Korean Patent Application No. 10-2008-0067702, filed in the Korean Intellectual Property Office on Jul. 11, 2008, the entire contents of which are hereby incorporated by reference.

BACKGROUND

The present invention described herein relates to a semiconductor device, and more particularly, to a semiconductor device including a driving transistor.

Semiconductor devices include memory devices for storing data, logic devices for processing data and performing calculations, and hybrid devices for performing various functions at the same time. Types of memory devices include volatile memory devices which lose their stored data if power is interrupted and non-volatile memory devices which retain their stored data even if power is removed.

Demand for highly integrated semiconductor devices has increased substantially However, if the semiconductor device is highly integrated through simple scaling down, there may be various limitations. For example, if the minimum line width is reduced to several tens of nanometers, margins of processes for manufacturing a semiconductor device may become reduced. Additionally, it may be difficult to optimize all the characteristics of single components (e.g., various driving circuits and/or memory cells in a device) having various functions in the semiconductor device.

SUMMARY

The present invention provides a semiconductor device including a driving transistor optimized for a high degree of integration.

The present invention also provides a semiconductor device including a driving transistor and a memory cell, optimized for a high degree of integration.

According to one aspect of the present invention, a semiconductor device may include a driving active region defined in a substrate and at least three driving transistors disposed at the driving active region. The at least three driving transistors share one common source/drain; the at least three driving transistors include at least three individual source/drains, respectively; the at least three individual source/drains are independent from each other, and the common source/drain and the at least three individual source/drains are disposed in the driving active region.

In some embodiments, the driving active region may include a common portion and at least three branch portions. The branch portions may extend from the common portion and may be spaced apart from each other. The common source/drain may be disposed in at least the common portion, and the individual source/drains may disposed in the branch portions, respectively. Each driving transistor may include a driving gate pattern, the driving gate pattern being disposed on the branch portion between the individual source/drain and the common source/drain.

In some embodiments, the semiconductor device may further include at least three cell strings corresponding to the at least three driving transistors, respectively. Each of the cell strings may include a first selection gate line, a plurality of cell gate lines, and a second selection gate line, wherein one of the first selection gate line, the plurality of cell gate lines, and the second selection gate line is electrically connected to each of the individual source/drains.

In some embodiments, the driving transistors control a driving voltage higher than a supply voltage.

According to another aspect of the present invention, a semiconductor device may include: a driving active region defined in a substrate, the driving active region including a common portion and a first branch portion, a second branch portion, and a third branch portion, the first to third branch portions extending from the common portion and being spaced apart from each other; a first driving gate pattern, a second driving gate pattern, and a third driving gate pattern crossing over the first branch portion, the second branch portion and the third branch portion, respectively; a common source/drain disposed in at least the common portion; and a first individual source/drain, a second individual source/drain and a third individual source/drain disposed in the first, second and third branch portions at one side of the first, second and third driving gate patterns, respectively, the first to third individual source/drains being spaced apart from each other.

In some embodiments, the semiconductor device may further include a first cell string, a second cell string, and a third cell string disposed in a cell region of the substrate, wherein the first cell string includes a gate line that is electrically connected to the first individual source/drain; the second cell string includes a gate line that is electrically connected to the second individual source/drain; and the third cell string includes a gate line that is electrically connected to the third individual source/drain.

In some embodiments, each of the first to third cell strings may include a first selection line, a plurality of cell gate lines, and a second selection gate line, and the gate lines that are electrically connected to the first to third individual source/drains may have the same type.

In some embodiments, the first branch portion, the common portion, and the third branch portion may be sequentially arranged along a first direction, and the common portion and the second branch portion may be sequentially arranged along a second direction perpendicular to the first direction.

In some embodiments, the semiconductor device may further include: a first landing conductive pattern disposed on the first individual source/drain and parallel to the first driving gate pattern; a second landing conductive pattern disposed on the second individual source/drain and parallel to the second driving gate pattern; a third landing conductive pattern disposed on the third individual source/drain and parallel to the third driving gate pattern; and a common landing conductive pattern disposed on the common source/drain.

In some embodiments, the semiconductor device may further include: a first interconnection line, a second interconnection line, and a third interconnection line electrically connected to the first to third individual source/drains, respectively; and a driving line electrically connected to the common source/drain.

In some embodiments, the driving active region may further include a fourth branch portion extending from the common portion and being spaced apart from the first to third branch portions. In this case, the semiconductor device may further include: a fourth driving gate pattern crossing over the fourth branch portion; and a fourth individual source/drain disposed in the fourth branch portion at one side of the fourth driving gate pattern and spaced apart from the first to third individual source/drains.

In some embodiments, the first branch portion, the common portion, and the third branch portion may be sequentially arranged along a first direction, and the second branch portion, the common portion, and the fourth branch portion may be sequentially arranged along a second direction perpendicular to the first direction.

In some embodiments, the semiconductor device may further include: a first cell string, a second cell string, a third cell string, and a fourth cell string disposed in a cell region of the substrate. The first cell string may include a gate line that is electrically connected to the first individual source/drain, the second cell string may include a gate line that is electrically connected to the second individual source/drain, the third cell string may include a gate line that is electrically connected to the third individual source/drain, and the fourth cell string may include a gate line that is electrically connected to the fourth individual source/drain.

In some embodiments, a driving voltage higher than a supply voltage may be supplied to the common source/drain.

According to another aspect of the present invention, a semiconductor device may include: a plurality of driving active regions arranged two-dimensionally in a driving circuit region of a substrate, each of the driving active regions including a common portion and a first branch portion, a second branch portion, and a third branch portion, the first to third branch portions extending from the common portion; a first driving gate pattern, a second driving gate pattern, and a third driving gate pattern disposed on each of the driving active regions, the first, second and third driving gate patterns crossing over the first, second and third branch portions, respectively; a first individual source/drain, a second individual source/drain, and a third source/drain disposed in each of the driving active regions, the first, second and third individual source/drains being respectively disposed in the first, second and third branch portions at one side of the first to third driving gate patterns and being spaced apart from each other; and a common source/drain disposed in each of the driving active regions, the common source/drain being disposed at least in the common portion.

In some embodiments, the semiconductor devices may further include a first cell string, a second cell string, and a third cell string, disposed in a cell region of the substrate. The driving active regions may form a plurality of rows. A first selection gate line, a plurality of cell gate lines, and a second selection gate line of the first cell string may be electrically connected to the first individual source/drains in one of the rows, respectively. A first selection gate line, a plurality of cell gate lines, and a second selection gate line of the second cell string may be electrically connected to the second individual source/drains in the one row, respectively. A first selection gate line, a plurality of cell gate lines, and a second selection gate line of the third cell string may be electrically connected to the third individual source/drains in the one row, respectively.

In some embodiments, the driving active regions may include: first driving active regions constituting a plurality of first rows and a plurality of first columns; and second driving active regions constituting a plurality of second rows and a plurality of second columns, wherein the first columns and the second columns are alternately arranged in a first direction and the first rows and the second rows are alternately arranged in a second direction perpendicular to the first direction.

In some embodiments, the first branch portion, common portion, and third branch portion of each of the first driving active regions may be arranged along the first direction, and a first branch portion, common portion, and third branch portion of each of the second driving active regions may be arranged along the first direction. In this case, the second branch portion of each of the first driving active regions may extend toward the second row and the second branch portion of each of the second driving active regions may extend toward the first row, in the first and second rows adjacent to each other. The first direction may be a longitudinal direction of a gate line in a cell region of the substrate.

In some embodiments, the second branch portions of the first row and the second branch portions of the second row, in the first row and second row adjacent to each other, may overlap in the first direction.

In some embodiments, the first branch portion, common portion, and third branch portion of each of the first driving active regions may be arranged along the second direction, and the first branch portion, common portion, and third branch portion of each of the second driving active regions may be arranged along the second direction. In this case, the second branch portion of each of the first driving active regions may extend toward the second column and the second branch portion of each of the second driving active regions may extend toward the first column, in the first column and second column adjacent to each other. The first direction may be a longitudinal direction of a gate line in a cell region of the substrate.

In some embodiments, the second branch portions of the first column and the second branch portions of the second column, in the first column and second column adjacent to each other, may overlap in the second direction.

In some embodiments, the common source/drains in the first column and second column adjacent to each other may be electrically connected to one driving line.

In some embodiments, each of the driving active regions may further include a fourth branch portion extending from the common portion. In these embodiments, the semiconductor device may further include: a fourth driving gate pattern disposed on each of the driving active regions to cross over the fourth branch portion; and a fourth individual source/drain disposed in the fourth branch portion at one side of the fourth driving gate pattern in each of the driving active regions.

In some embodiments, the semiconductor device may further include a first cell string, a second cell string, a third cell string, and a fourth cell string disposed in a cell region of the substrate. The driving active regions may form a plurality of rows. In this case, a first selection gate line, a plurality of cell gate lines, and a second selection gate line of the first cell string may be electrically connected to the first individual source/drains in one of the rows, respectively. A first selection gate line, a plurality of cell gate lines, and a second selection gate line of the second cell string may be electrically connected to the second individual source/drains in the one row, respectively. A first selection gate line, a plurality of cell gate lines, and a second selection gate line of the third cell string may be electrically connected to the third individual source/drains in the one row, respectively. A first selection gate line, a plurality of cell gate lines, and a second selection gate line of the fourth cell string may be electrically connected to the fourth individual source/drains in the row, respectively.

In some embodiments, the first branch portion, the common portion, and the third branch portion may be arranged along a first direction, and the second branch portion, the common portion, and the fourth branch portion are arranged along a second direction perpendicular to the first direction, in each of the driving active regions.

BRIEF DESCRIPTION OF THE FIGURES

The foregoing and other features and advantages of the invention will be apparent from the more particular description of preferred embodiments of the invention, as illustrated in the accompanying drawings in which like reference characters refer to the same parts throughout the different views. The drawings are not necessarily to scale, emphasis instead being placed upon illustrating the principles of the invention. In the drawings, the thickness of layers and regions are exaggerated for clarity.

DETAILED DESCRIPTION OF PREFERRED EMBODIMENTS

Preferred embodiments of the present invention will be described below in more detail with reference to the accompanying drawings. The present invention may, however, be embodied in different forms and should not be construed as limited to the embodiments set forth herein. Rather, these embodiments are provided so that this description will be thorough and complete, and will fully convey the present invention to those skilled in the art. In the figures, the dimensions of layers and regions are exaggerated for clarity of illustration. It will also be understood that when a layer (or film) is referred to as being 'on' another layer or substrate, it can be directly on the other layer or substrate, or intervening layers may also be present. Further, it will be understood that when a layer is referred to as being 'under' another layer, it can be directly under, and one or more intervening layers may also be present. In addition, it will also be understood that when a layer is referred to as being 'between' two layers, it can be the only layer between the two layers, or one or more intervening layers may also be present.

Figure 1:
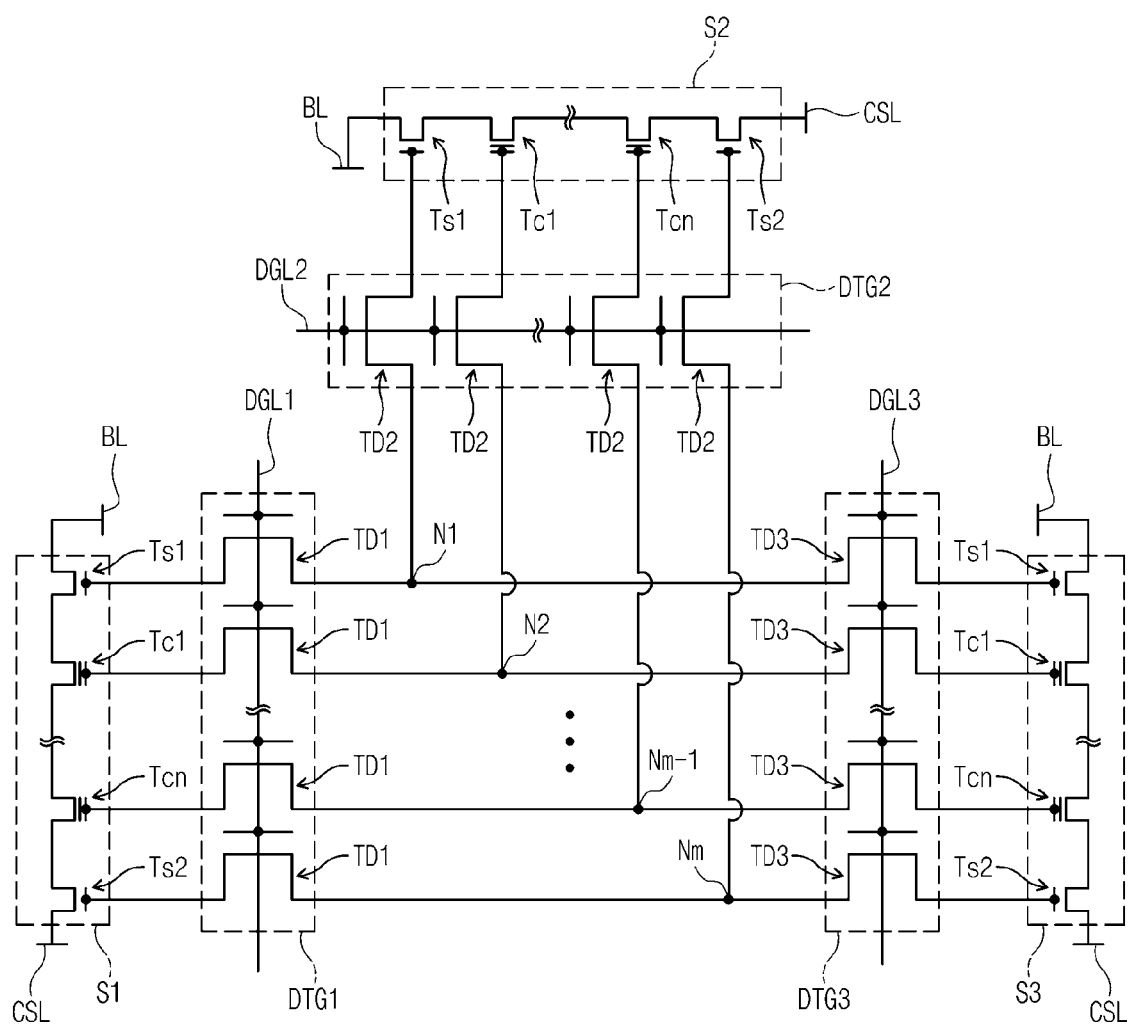
FIG. 1 is an equivalent circuit diagram illustrating a semiconductor device according to a first embodiment of the present invention.

FIG. 1 is an equivalent circuit diagram illustrating a semiconductor device according to a first embodiment of the present invention.

Referring to FIG. 1, the semiconductor device may include a first driving transistor group DTG1, a second driving transistor group DTG2, a third driving transistor group DTG3, a first cell string S1, a second cell string S2, and a third cell string S3. The first cell string S1, the second cell string S2, and the third cell string S3 may correspond to the first driving transistor group DTG1, the second driving transistor group DTG2, and the third driving transistor group DTG3, respectively. Each of the first to third cell strings S1 to S3 may include a first selection transistor Ts1, a plurality of cell transistors Tc1 to Tcn, and a second selection transistor Ts2, which are connected in series. A first source/drain of the first selection transistor Ts1 is electrically connected to a bit line BL, and a second source/drain of the first selection transistor Ts1 is connected to one end of the plurality of cell transistors Tc1 to Tcn which are connected in series. A first source/drain of the second selection transistor Ts2 is electrically connected to a common source line CSL and a second source/drain of the second selection transistor Ts2 is connected to the other end of the plurality of cell transistors Tc1 to Tcn. The cell transistor which is the most adjacent to the first selection transistor Ts1 may be defined as a first cell transistor Tc1, and the cell transistor which is the most adjacent to the second selection transistor Ts2 may be defined as an $n^{th}$ cell transistor Tcn. The number of the cell transistors Tc1 to Tcn may be $2^k$ (k is a natural number). Each of the cell transistors Tc1 to Tcn may include a charge storage portion. Each of the cell transistors Tc1 to Tcn may be a non-volatile memory cell.

The first driving transistor group DTG1 may include a plurality of first driving transistors TD1, which respectively correspond to the first selection transistor Ts1, the plurality of cell transistors Tc1 to Tcn, and the second selection transistor Ts2 in the first cell string S1. First source/drains of the first driving transistors TD1 may be electrically connected to a gate of the first selection transistor Ts1, gates of the cell transistors Tc1 to Tcn, and a gate of the second selection transistor Ts2 in the first cell string S1, respectively. The number of the first driving transistors TD1 in the first driving transistor group DTG1 may be the same as the sum of the number of the cell transistors Tc1 to Tcn and the number of the first and second selection transistors Ts1 and Ts2 in the first cell string S1. In the same manner, the second driving transistor group DTG2 may include a plurality of second driving transistors TD2, which respectively correspond to the first selection transistor Ts1, a plurality of cell transistors Tc1 to Tcn, and the second selection transistor Ts2 in the second cell string S2, respectively. First source/drains of the second driving transistors TD2 are electrically connected to a gate of the first selection transistor Ts1, gates of the cell transistors Tc1 to Tcn, and a gate of the second selection transistor Ts2 in the second cell string S2, respectively. The third driving transistor group DTG3 may include a plurality of third driving transistors TD3, which correspond to the first selection transistor Ts1, the plurality of cell transistors Tc1 to Tcn, and the second selection transistor Ts2 in the third cell string S3, respectively. First source/drains of the third driving transistors TD3 are electrically connected to a gate of the first selection transistor Ts1, gates of the cell transistors Tc1 to Tcn, and a gate of the second selection transistor Ts2 in the third cell string S3, respectively.

Second source/drains of the first driving transistors TD1 may be electrically connected to a plurality of nodes N1 to Nm, respectively. In the same manner, second source/drains of the second driving transistors TD2 are electrically connected to the plurality of nodes N1 to Nm, respectively, and second source/drains of the third driving transistors TD3 are electrically connected to the plurality of nodes N1 to Nm, respectively. In more detail, the first node N1 may be electrically connected to second source/drains of the first, second and third driving transistors TD1, TD2 and TD3 being connected to the gates of the first selection transistors Ts1 of the first, second and third cell strings S1, S2 and S3. The second node N2 may be electrically connected to the second source/drains of the first, second and third driving transistors TD1, TD2 and TD3 connected to the gates of the first cell transistors Tc1 in the first, second and third cell strings S1, S2 and S3. The m–$1^{th}$ node Nm–1 may be electrically connected to the second source/drains of the first, second and third driving transistors TD1, TD2 and TD3 connected to the gates of the $n^{th}$ cell transistors in the first, second and third cell strings S1, S2 and S3, and the $m^{th}$ node Nm may be electrically connected to the second source/drains of the first, second and third driving transistors TD1, TD2 and TD3 connected to the gates of the second selection transistors Ts2 in the first, second and third cell strings S1, S2 and S3.

Driving voltages independent from each other may be supplied to the plurality of nodes N1 to Nm, respectively. The driving voltages may be supplied through a plurality of diving lines (not shown) that are electrically connected to the nodes N1 to Nm, respectively. The gates of the first driving transistors TD1 may be electrically connected to a first driving gate line DGL1, the gates of the second driving transistors TD2 may be electrically connected to a second driving gate line DGL2, and the gates of the third driving transistors TD3 may be electrically connected to a third driving gate line DGL3. The first to third driving gate lines DGL1 to DGL3 may be separately controlled. For example, in the case in which the first cell string S1 is selected, a turn-on voltage is supplied through the first driving gate line DGL1 to turn on the first driving transistors TD1. Turn-off voltages are supplied through the second and third driving gate lines DGL2 and DGL3 to turn off the second and third driving transistors TD2 and TD3. Therefore, the driving voltages are respectively supplied to the gates of the transistors Ts1, Tc1 to Tcn, and Ts2 of the first cell string S1 through the nodes N1 to Nm, and the driving voltages are not supplied to the gates in the second and third cell string S2 and S3.

The driving voltages may be a high voltage higher than a supply voltage. Accordingly, the first to third driving transistors TD1 to TD3 may control a high voltage. The supply voltage may be an operating voltage (i.e., an operating voltage of the semiconductor device) that the semiconductor device directly receives. The high voltage may be obtained by raising the supply voltage through a voltage boosting circuit in the semiconductor device.

The three driving transistors TD1, TD2 and TD3 are connected in parallel to each of the nodes N1 to Nm. Therefore, the first, second and third driving transistors TD1, TD2 and TD3 connected to each of the N1 to Nm may share one common source/drain. As a result, an area that the first, second third driving transistors TD1, TD2 and TD3 connected in parallel occupy is reduced. That is, an area that one driving transistor occupies is reduced. Therefore, the highly integrated semiconductor device according to the invention is realized. Additionally, the driving transistors TD1, TD2 and TD3 can control a high voltage. Accordingly, each of the driving transistors TD1, TD2 and TD3 may have a larger size than each of the cell transistors Tc1 to Tcn. As a result, since areas of the driving transistors TD1 to TD3 having a relatively large size are reduced, the semiconductor device can be effectively highly integrated.

A semiconductor device realized according to the one embodiment of the present invention will be described with reference to FIGS. 2 to 4.

Figure 2:
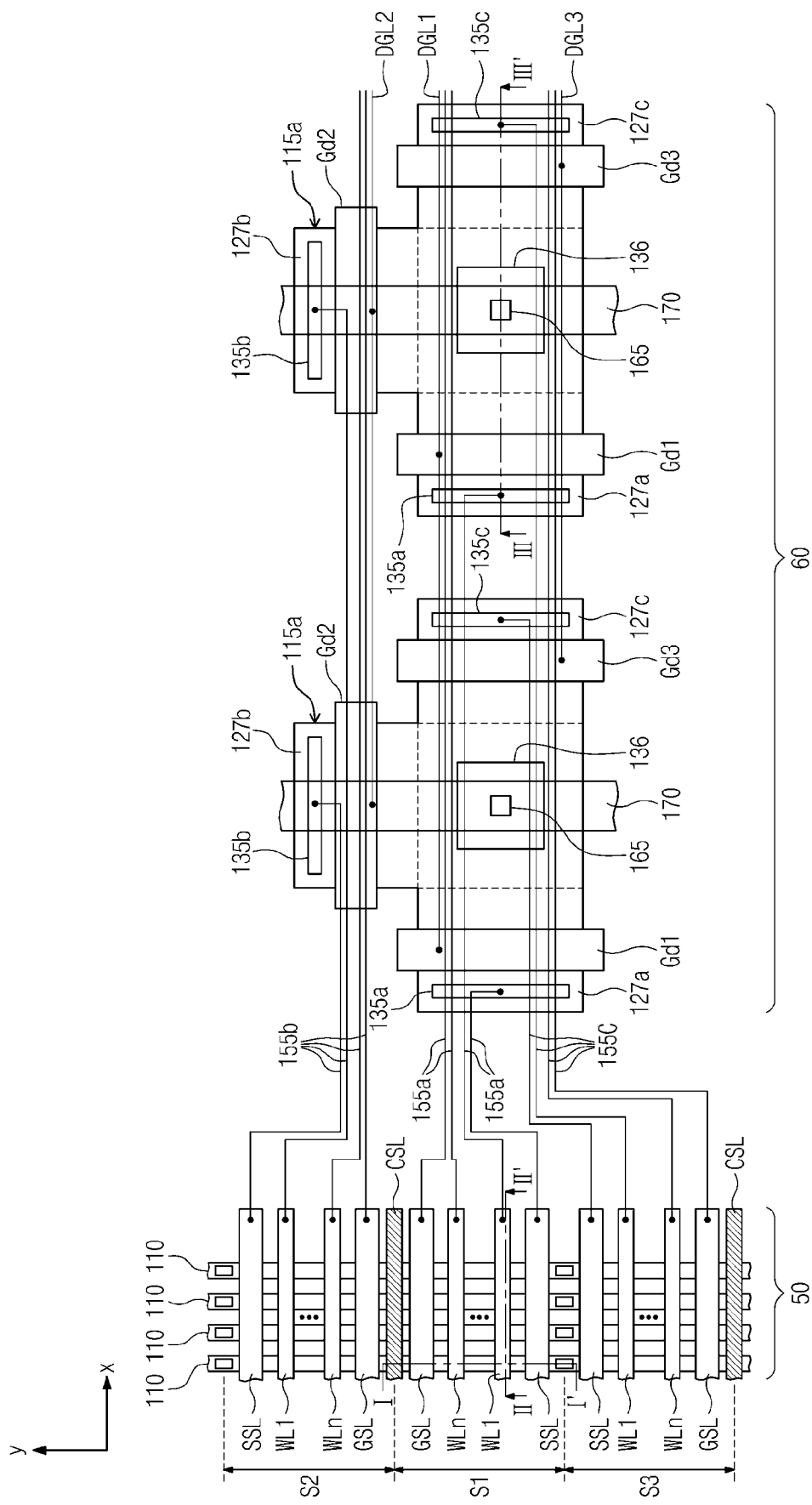
FIG. 2 is a plan view of a semiconductor device according to one embodiment of the present invention.

FIG. 2 is a plan view of a semiconductor device according to one embodiment of the present invention. FIG. 3 is a cross-sectional view taken along lines of I-I', II-II', and III-III' of FIG. 2. FIG. 4 is a plan view illustrating a driving active region of FIG. 2. FIG. 5 is a cross-sectional view illustrating a cell transistor of a semiconductor device of FIG. 3.

Figure 3:
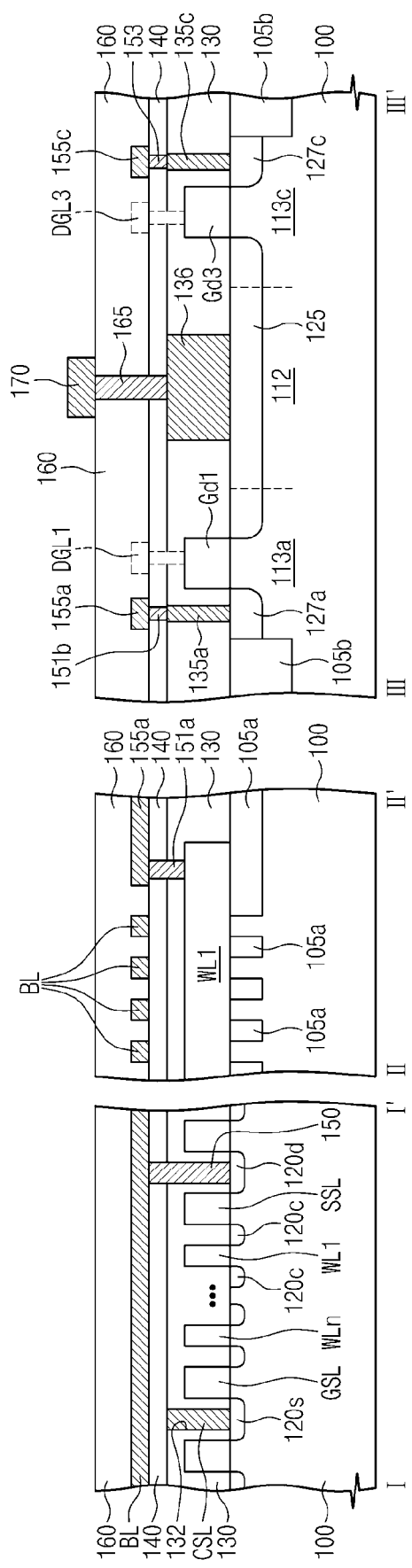
FIG. 3 is a cross-sectional view taken along lines of I-I', II-II', and III-III' of FIG. 2.

Referring to FIGS. 2 and 3, a semiconductor substrate 100 (hereinafter, referred to as a substrate) may include a cell region 50 and a driving circuit region 60. The driving circuit region 60 may be a decoder circuit region, for example. A first device isolation pattern 105a is disposed on the substrate 100 in the cell region 50 to define cell active regions 110, and a second device isolation pattern 105b are disposed on the substrate 100 in the driving circuit region 60 to define driving active regions 115a. A plurality of driving active regions 115a may be arranged along a first direction in the driving circuit region 60 to form one row. The first direction may correspond to an x-axis direction of FIG. 2. The cell active regions 110 may extend parallel to a second direction perpendicular to the first direction in the cell region 50. The second direction may correspond to a y-axis direction. Each of cell active regions 110 may correspond to a portion of the substrate 100 surrounded by the first device isolation pattern 105a. Each of driving active regions 115a may correspond to a portion of the substrate 100 surrounded by the second device isolation pattern 105b. The first and second device isolation patterns 105a and 105b may be formed with a trench type device isolation pattern. Driving transistors formed at the driving active region 115a may control a high voltage higher than a supply voltage. Accordingly, the second device isolation pattern 105b may be formed deeper than the first device isolation pattern 105a. That is, the bottom surface of the second device isolation pattern 105b may be lower than that of the first device isolation pattern 105a.

A first selection gate line SSL, a plurality of cell gate lines WL1 to WLn, and a second selection gate line GSL in a first cell string S1 cross over the cell active regions 110. The plurality of cell gate lines WL1 to WLn in the first cell string S1 are disposed between the first and second selection gate lines SSL, and GSL in the first string S1. The gate lines SSL, WL1 to WLn, and GSL in the first cell string S1 may extend parallel to each other along the first direction. That is, longitudinal directions of the gate lines SSL, WL1 to WLn, and GSL in the first cell string S1 may be identical to the first direction. A cell source/drain 120c is disposed in the cell active regions at both sides of each of the cell gate lines WL1 to WLn. a common drain 120d is disposed in each cell active region 110 at one side of the first selection gate line SSL, and a common source 120s is disposed in each cell active region 110 at one side of the second selection gate line GSL. The gate lines SSL, WL1 to WLn, and GSL in the first cell string S1 are disposed between the common drain 120d and the common source 120s. Transistors of the first cell string S1 may be disposed at the positions where the gate lines SSL, WL1 to WLn, and GSL and each active region 110 intersect. That is, each of the cell gate lines WL1 to WLn and the cell source/drain 120c adjacent thereto may constitute each of the cell transistors Tc1 to Tcn of FIG. 1. The first selection gate line SSL, the common drain 120d, and the cell source/drain 120c adjacent thereto may constitute the first selection transistor Ts1 of FIG. 1. The second selection gate line GSL, the common source 120s, and the cell source/drain 120c adjacent thereto may constitute the second selection transistors Ts2 of FIG. 1. Since the gate lines SSL, WL1 to WLn, and GSL cross over the plurality of active regions 110, the plurality of first cell strings are connected in parallel.

A common source line CSL is disposed at one side of the second selection gate line GSL in the first cell string S1. The common source line CSL may be electrically connected to the common sources 120s arranged along the first direction. The common source line CSL may be parallel to the second selection gate line GSL. Each of common drains 120d is electrically connected to bit line BL. A plurality of bit lines BL may be disposed over the plurality of cell active regions 110, respectively. The bit lines BL may be parallel to the cell active regions 110. The bit lines BL and the cell active regions 110 may completely overlap in a plan view. Accordingly, the bit lines BL are not illustrated in FIG. 2 for concise drawings, but are illustrated in FIG. 3.

A first selection gate line SSL, a plurality of cell gate lines WL1 to WLn, and a second selection gate line GSL in the second cell string S2 may cross over the cell active regions 110 at one side of the first cell string S1. A first selection gate line SSL, a plurality of cell gate line WL1 to WLn, and a second selection gate line GSL in the third cell string S3 may cross over the cell active regions 110 at the other side of the first cell string S1. Since the gate lines SSL, WL1 to WLn, and GSL of the second cell string S2 cross over the plurality of cell active regions 110, a plurality of second cell strings S2 may be connected in parallel. In the same manner, since the gate lines SSL, WL1 to WLn, and GSL of the third cell string S3 cross over the plurality of cell active regions 110, a plurality of third cell strings S3 may be connected in parallel.

The second cell string S2 may have a structure symmetric to that of the first cell string S1, with respect to the common source line CSL. The third cell string S3 may have a structure symmetric to that of the first cell string S1, with respect to the common drain 120d. The first and second cell strings S1 and S2 adjacent to each other may share the common source line CSL. Similarly, the first and third cell strings S1 and S3 adjacent to each other may share one common drain 120d.

A gate structure of each cell transistor will be described in detail with reference to FIG. 5. The cell transistor of FIG. 5 represents a first cell transistor. Other cell transistors may have the same form as the first cell transistor.

Referring to FIGS. 3 and 5, the first cell transistor may includes a first cell gate line WL1 crossing over the cell active region 110, and cell source/drains 120c disposed in the cell active regions 110 at both sides of the first cell gate line WL1. The first cell gate line WL1 may include a tunnel insulation layer 90, a charge storage layer 92, a blocking insulation layer 94, and a control gate electrode 96, which are subsequently stacked. The control gate electrode 96 crosses over the plurality of cell active regions 110. The control gate electrode 96 may correspond to a word line. The charge storage layer 92 may include a semiconductor material. Unlike this, the charge storage layer 92 may include an insulating material having traps for storing charges. For example, the charge storage layer 92 may include at least one of insulating materials including a nitride, an oxide nitride, nano dots and metal oxide, etc. The nano dots may be formed of a metal or a semiconductor material. The blocking insulation layer 94 may include a high-k material (e.g., an insulating metal oxides (such as $HFO_2$ and/or AlO, etc) having a higher dielectric constant than the tunnel insulation layer 90.

A threshold voltage of the first cell transistor may vary by the difference in the amount of charge stored in the charge storage layer 92. Data stored in the first cell transistor can be determined by using the threshold voltage difference. The cell source/drain 120c may be a region doped with a dopant (ex, n-type dopant or p-type dopant). Unlike this, the cell source/drain 120c may be an inversion layer formed by a fringe field occurring when a driving voltage is applied to the control gate electrode 96. The common source 120s and the common drain 120d may be a region doped with a dopant (ex, n-type dopant or p-type dopant).

Next, the driving active region 115a and the driving transistor of the driving circuit region 60 will be described with reference to FIG. 4.

Figure 4:
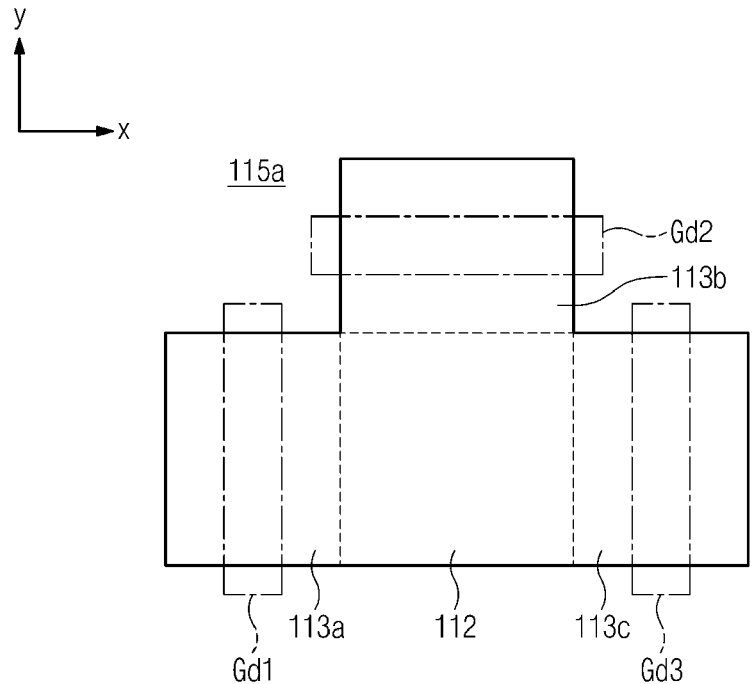
FIG. 4 is a plan view illustrating a driving active region of FIG. 2.
Figure 5:
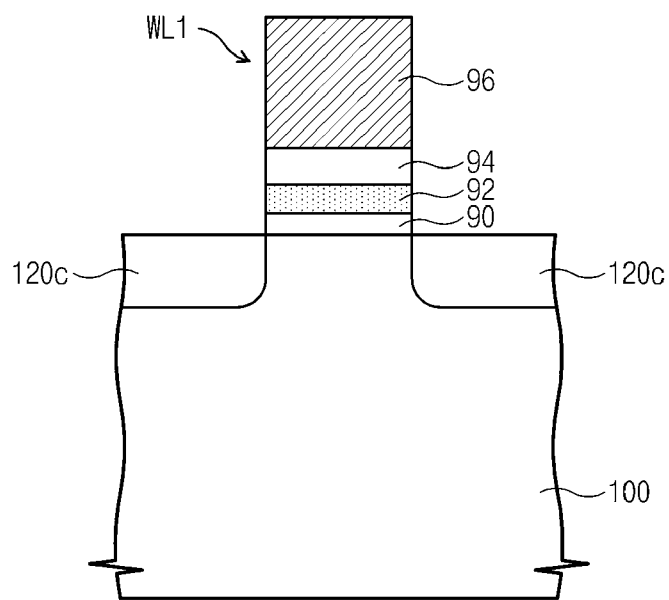
FIG. 5 is a cross-sectional view illustrating a cell transistor of a semiconductor device of FIG. 3.

Referring to FIGS. 2, 3, and 4, as mentioned above, the plurality of driving active regions 115a in the driving circuit region 60 are arranged along the first direction to form one row. The driving active regions 115a in the row are spaced apart from each other in the first direction. Each driving active region 115a may include a common portion 112, a first branch portion 113a, a second branch portion 113b, and a third branch portion 113c. The first, second and third branch portions 113a, 113b and 113c extend from the common portion 112. The first, second and third branch portions 113a, 113b and 113c are spaced apart from each other. That is, the first, second and third branch portions 113a, 113b and 113c may extend from the individually different sides of the common portion 112. Of course, the first, second and third branch portions 113a, 113b and 113c and the common portion 112 directly contact. The first branch portion 113a, the common portion 112, and the third branch portion 113c may be sequentially arranged in the first direction (i.e., the x-axis direction or longitudinal directions of the gate lines SSL, WL1 to WLn, and GSL). In this case, the second branch portion 113b and the common portion 112 may be arranged in the second direction (i.e., the y-axis direction).

A first driving gate pattern Gd1, a second driving gate pattern Gd2, and a third driving gate pattern Gd3 cross over the first, second and third branch portions 113a, 113b and 113c in each driving active region 115a, respectively. The first and third driving gate patterns Gd1 and Gd3 may extend parallel to each other in the second direction. The second driving gate pattern Gd2 may extend in the first direction. That is, the first and third driving gate patterns Gd1 and Gd3 may be perpendicular to the second driving gate pattern Gd2. The first, second and third driving gate patterns Gd1, Gd2 and Gd3 may be spaced apart from each other. Each of the first, second and third driving gate patterns Gd1, Gd2 and Gd3 may include a driving gate insulation layer and a driving gate electrode, which are sequentially stacked.

A common source/drain 125 is disposed in at least the common portion 112. A first individual source/drain 127a, a second individual source/drain 127b, and a third individual source/drain 127c may be formed in the first, second and third branch portions 113a, 113b and 113c, respectively. The first, second and third individual source/drains 127a, 127b and 127c are spaced apart from each other, and are spaced apart from the common source/drain 125. That is, the first driving gate pattern Gd1 is disposed on the first branch portion 113a between the common source/drain 125 and the first individual source/drain 127a. In the same manner, the second driving gate pattern Gd2 is disposed on the second branch portion 113b between the common source/drain 125 and the second individual source/drain 127b, and the third driving gate pattern Gd3 is disposed on the third branch portion 113c between the common source/drain 125 and the third individual source/drain 127c. When the first, second and third driving gate patterns Gd1, Gd2, and Gd3 are spaced apart from the common portion 112, the common source/drain 125 may extend into the first, second and third branch portions 127a, 127b and 127c between the driving gate patterns Gd1, Gd2 and Gd3 and the common portion 112. The first driving gate pattern Gd1, the first individual source/drain 127a, and the common source/drain 125 may constitute the first driving transistor TD1 of FIG. 1. The second driving gate pattern Gd2, the second individual source/drain 127b, and the common source/drain 125 may constitute the second driving transistor TD2 of FIG. 1. The third driving gate pattern Gd3, the third individual source/drain 127c, and the common source/drain 125 may constitute the third driving transistor TD3 of FIG. 1. The first to third driving transistors TD1, TD2, and TD3 share one common source/drain 125. The common source/drain 125 may correspond to each of the nodes N1 to Nm of FIG. 1. The common source/drains 125 in the plurality of driving active regions 115a constituting the row corresponds to each of the nodes N1 to Nm.

The number of the driving active regions 115a constituting the row may be the same as the number of the gate lines SSL, WL1 to WLn, and GSL in the first cell string S1. The gate lines SSL, WL1 to WLn, and GSL in the first cell string S1 may be electrically connected to the first individual source/drains 127a of the driving active regions 115a in the row, respectively. The gate lines SSL, WL1 to WLn, and GSL in the second cell string S2 may be electrically connected to the second individual source/drains 127b of the driving active regions 115a in the row, respectively. The gate lines SSL, WL1 to WLn, and GSL in the third cell string S3 may be electrically connected to the third individual source/drains 127c of the driving active regions 115a in the row, respectively. The first individual source/drains 127a may be electrically connected to the gate lines SSL, WL1 to WLn, and GSL of the first cell string S1 by first interconnection lines 155a, respectively. The second individual source/drains 127b may be electrically connected to the gate lines SSL, WL1 to WLn, and GSL of the second cell string S2 by second interconnection lines 155b, respectively. The third individual source/drains 127c may be electrically connected to the gate lines SSL, WL1 to WLn, and GSL of the third cell string S3 by third interconnection lines 155c.

The first driving gate patterns Gd1 in the row may be electrically connected to one first driving gate line DGL1. In the same manner, the second driving gate patterns Gd2 in the row is electrically connected to one second driving gate line DGL2, and the third driving gate patterns Gd3 in the row is electrically connected to one third driving gate line DGL3. The first, second and third driving gate lines DGL1, DGL2 and DGL3 may be separate from each other.

In FIG. 2, for the purpose of clarity of the drawing, the first to third interconnection lines 155a to 155c, and the driving gate lines DGL1 to DGL3 are illustrated with a solid line. In contrast, in FIG. 3, for the purpose of clarity of the description, the interconnection lines 155a to 155c and the driving gate lines DGL1 to DGL3 are illustrated with enlargement. The driving transistors in the driving circuit region 60 may control a high voltage. Therefore, the driving transistors may have a larger size than the selection and cell transistors in the cell region 50. The enlargement rate of the cell region 50 may be different from that of the driving circuit region 50 in FIGS. 2 and 3.

A first interlayer insulation layer 130 may be disposed on an entire surface of a substrate 100 including the gate lines SSL, WL1 to WLn, and GSL and the driving gate patterns Gd1, Gd2 and Gd3 of the cell strings S1, S2, and S3. The common source line CSL in the cell region 50 may fill a groove 132 formed in the first interlayer insulation layer 130. The groove 132 is parallel to the second selection gate line GSL, and may simultaneously expose the common sources 120s arranged along the first direction.

A first landing conductive pattern 135a may be disposed on each first individual source/drain 127a. The first landing conductive pattern 135a may extend parallel to the first driving gate pattern Gd1. A second landing conductive pattern 135b may be disposed on each second individual source/drain 127b, and the third landing conductive pattern 135c may be disposed on the third individual source/drain 127c. The second landing conductive pattern 135b may extend parallel to the second driving gate pattern Gd2, and the third landing conductive pattern 135c may extend parallel to the third driving gate pattern Gd3. The first to third landing conductive patterns 135a to 135c may include a conductive material with a lower resistivity than the first to third individual source/drains 127a to 127c. The common landing conductive pattern 136 may be disposed on the common source/drain 125. The common landing conductive pattern 136 may be formed of the same conducive material as the first to third landing conductive patterns 135a to 135c. For example, the landing conductive patterns 135a, 135b, 135c and 136 may includes at least one material selected from conductive metal nitride (e.g., nitride titanium, nitride tantalum, etc.), metal silicide (e.g., tungsten silicide, cobalt silicide, etc.), and metal (e.g., tungsten, aluminum, copper, titanium, tantalum, etc.). The landing conductive patterns 135a, 135b, 135c and 136 pass through the first interlayer insulation layer 130 and then contact the source/drains 127a, 127b, 127c, and 125, respectively. The landing conductive patterns 135a, 135b, 135c, and 136 may include the same material as the common source line CSL. The landing conductive patterns 135a, 135b, 135c, and 136 and the common source line CSL may be formed simultaneously. Top surfaces of the first interlayer insulation layer 130, the landing conductive patterns 135a, 135b, 135c, and 136, and the common source line CSL may be coplanar.

The second interlayer insulation layer 140 may be disposed on the first interlayer insulation layer 130, the landing conductive patterns 135a, 135b, 135c, and 136, and the common source line CSL. The bit line plug 150 penetrates the second and first interlayer insulation layers 140 and 130 in the cell region 50 to contact the common drain 120d. The bit line BL is disposed on the second interlayer insulation layer 140 in the cell region 50 to contact the bit line plug 150. The bit line plug 150 and the bit line BL may be formed of a conductive material.

The first to third interconnection lines 155a, 155b, and 155c may be disposed on the second interlayer insulation layer 140. The first to third interconnection lines 155a, 155b, and 155c may extend from the driving circuit region 60 to the cell region 50. Portions of the first to third interconnection lines 155a, 155b, and 155c in the driving circuit region 60 may extend in the first direction. The first interconnection lines 155a may be arranged with an equal interval. Likewise, the second interconnection lines 155a may be arranged with an equal interval, and the third interconnection lines 155c may be arranged with an equal interval. The first to third interconnection lines 155a, 155b, and 155c may have portions extending in the second direction and being disposed over the first to third landing conductive patterns 135a, 135b, and 135c, respectively, for electrical connection with the first to third landing conductive patterns 135a, 135b, and 135c.

The first to third interconnection lines 155a, 155b, and 155c may be disposed at the same height. One end of the first interconnection line 155a may be connected to the contact plug 151a that penetrates the second and first interlayer insulation layers 140 and 130 to contact each of the gates lines SSL, WL1 to WLn, and GSL of the first cell string S1. The other end of the first interconnection line 155a may be connected to the contact plug 151b that penetrates the second interlayer insulation layer 140 to contact the first landing conductive pattern 135a. In the same manner, one end of the second interconnection line 155b may be connected to a contact plug that penetrates the second and first interlayer insulation layers 140 and 130 to contact each of the gates lines SSL, WL1 to WLn, and GSL of the second cell string S2. The other end of the second interconnection line 155b may be connected to a contact plug that penetrates the second interlayer insulation layer 140 to contact the second landing conductive pattern 135b. One end of the third interconnection line 155c may be connected to a contact plug that penetrates the second and first interlayer insulation layers 140 and 130 to contact each of the gates lines SSL, WL1 to WLn, and GSL of the third cell string S3. The other end of the third interconnection line 155c may be connected to a contact plug 153 that penetrates the second interlayer insulation layer 140 to contact the third landing conductive pattern 135c. The contact plugs 151a, 151b, and 153 contacting the interconnection lines 155a, 155b, and 155c and the bit line plug 150 may be simultaneously formed. Accordingly, the contact plugs 151a, 151b, and 153 contacting the interconnection lines 155a, 155b, and 155c may include the same conductive material as the bit line plug 150. The interconnection lines 155a, 155b, and 155c and the bit line BL may be simultaneously formed.

The first to third driving gate lines DGL1 to DGL3 may be disposed on the second interlayer insulation layer 140 in the driving circuit region 60. The first to third driving gate lines DGL1 to DGL3 may extend along the first direction. The first to third driving gate lines DGL1 to DGL3 may be connected to contact plugs that penetrate the second and third interlayer insulation layers 140 and 130 in the driving circuit region 60 to contact the first to third driving gate lines DGL1 to DGL3. The first to third driving gate lines DGL1 to DGL3 and the interconnection lines 155a to 155c may be simultaneously formed. That is, the first to third driving gate lines DGL1 to DGL3 may be disposed at the same height and include the same conductive material as the interconnection lines 155a to 155c.

An upper interlayer insulation layer 160 may be disposed on an entire surface of the substrate 100 including the interconnection lines 155a, 155b, and 155c, the driving gates DGL1 to DGL3, and the bit line BL. A driving contact plug 165 may penetrate the upper interlayer insulation layer 160 and the second interlayer insulation layer 140 to contact the common landing conductive pattern 136, and a driving line 170 may be disposed on the upper interlayer insulation layer 160 to contact the driving contact plug 165. A driving voltage is supplied to the common source/drain 125 through the driving line 170. The driving voltage may be higher than the supply voltage. A plurality of driving lines 125 may be electrically connected to the plurality of common source/drains 125 in the row, respectively. The driving lines 125 may extend parallel to each other along the second direction.

The adjacent first to third cell strings S1 to S3 connected to the driving transistors in the row may be defined as a cell string group. In this case, the cell string group and the row including the plurality of driving active regions 115a corresponding thereto may be repeatedly arranged along the second direction.

According to the above-described semiconductor device, three driving transistors may be formed in one driving active region 115a. Therefore, the three driving transistors share one common source/drain 125 formed in the driving active region 115a. Accordingly, an area that the three driving transistors occupy in the semiconductor device is reduced. As a result, a semiconductor device optimized for a high degree of integration is realized. Additionally, since the driving transistors may control a high voltage, they may have a larger size than a cell transistor. Therefore, the semiconductor device can be effectively and highly integrated by reducing areas of the driving transistors having a large size.

Additionally, the landing conducive patterns 135a, 135b, 135c, and 136 may be respectively disposed on the source/drains 127a, 127b, 127c, and 125 of the driving transistors. Therefore, the depth of the contact holes for connecting the source/drains 127a, 127b, 127c, and 125 with the lines 155a, 155b, 155c, and 170 can be reduced. As a result, a process margin of forming the contact holes can be increased, and an aspect ratio of the contact holes can be reduced.

Furthermore, the landing conductive patterns 135a, 135b, and 135c disposed on the individual source/drains 127a, 127b, and 127c may have bar forms extending in the longitudinal directions of the driving gate patterns Gd1, Gd2, and Gd3, respectively. Accordingly, the distance between each of the landing conductive patterns 135a, 135b, and 135c and each of channel regions (defined below the driving gate patterns Gd1, Gd2, and Gd3, respectively) may be substantially uniform. For example, the channel region below the first driving gate pattern Gd1 may include the middle portion and the edge portion adjacent to the second device isolation pattern 105b. The shortest distance between the middle portion and the first landing conductive pattern 135a may be defined as a first distance, and the shortest distance between the edge portion and the first landing conductive pattern 135a may be defined as a second distance. At this point, a difference between the first and second distance can be minimized. As a result, the first driving transistor may output an amount of turn-on current through substantially the entire channel width of the channel region. That is, amounts of a turn-on current of the driving transistors can be increased by the landing conductive patterns 135a, 135b, and 135c, and thus a semiconductor device having an excellent characteristic is realized. Additionally, since three driving transistors are integrated into the driving active region 115a, the interconnection lines 155a, 155b, and 115c can be dense. Since the landing conductive patterns 135a, 135b, and 135c may be formed with a bar form, the interconnection lines 155a, 155b, and 155c can contact the landing conductive patterns 135a, 135b, and 135c without difficulty. The interconnection lines 155a, 155b, and 155c may partially contact the upper surfaces of the landing conducive patterns 135a, 135b, and 135c. Since the landing conducive patterns 135a, 135b, and 135c include a conductive material having a lower resistivity than the individual source/drains 127a, 127b, and 127c, resistance between the interconnection lines 155a, 155b, and 155c and the individual source/drains 127a, 127b, and 127c is reduced. Additionally, even if the interconnection lines 155a, 155b, and 155c contact the edges of the upper surfaces of the landing conductive patterns 135a, 135b, and 135c, output driving voltages of the driving transistors may be sufficiently supplied to the gate lines SSL, WL1 to WLn, and GSL because of the low resistivity of the landing conductive patterns 135a, 135b, and 135c.

In the above-described semiconductor device, the first to third interconnection lines 115a to 115c and the driving gate line DGL1 to DGL3 may be disposed at the same height. Alternatively, at least one of the lines 155a, 155b, 155c, DGL1, DGL2, DGL3 may be disposed at a different height from the others. This will be described with reference to the drawings.

Figure 6:
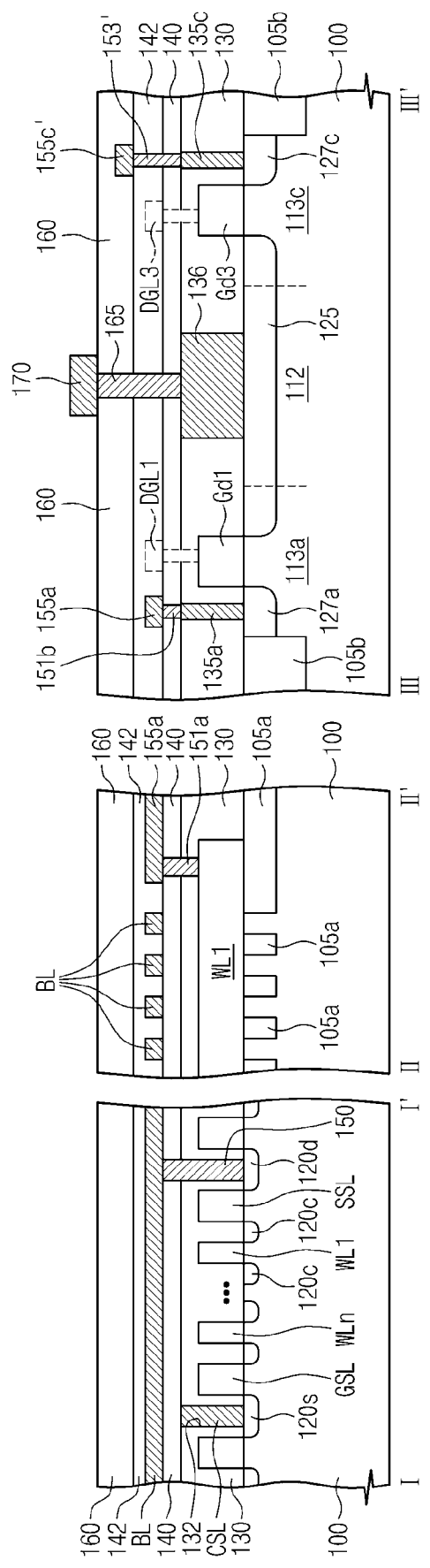
FIG. 6 is a cross-sectional view taken along lines of I-I', II-II', and III-III' of FIG. 2 illustrating a modification of the semiconductor device according to the first embodiment.

FIG. 6 is a cross-sectional view taken along lines of I-I', II-II', and III-III' of FIG. 2 illustrating a modification of the semiconductor device according to the first embodiment.

Referring to FIG. 6, driving gate lines DGL1 to DGL3 may be disposed on a second interlayer insulation layer 140. At least one of the first interconnection line 155a, the second interconnection line 155b of FIG. 2, and the third interconnection line 155c' may be disposed on the second interlayer insulation layer 140 such that it may be disposed at the same height as the driving gate line DGL1 to DGL3. In the exemplary embodiment of FIG. 6, the first interconnection line 155a is shown as having the same height as the driving gate lines DGL1 to DGL3.

A third interlayer insulation layer 142 may be disposed on the first interconnection line 155a, the driving gate lines DGL1 to DGL3, the bit lines BL, and the second interlayer insulation layer 140. A third interconnection lines 155c' may be disposed on the third interlayer insulation layer 142. That is, the third interconnection lines 155c' may be disposed higher than the first interconnection lines 155a and the driving gate lines DGL1 to DGL3. A contact plug 153' between the third interconnection line 155c' and the third landing conductive pattern 135c may continuously penetrate the third and second interlayer insulation layers 142 and 140. A contact plug (not shown) between each of third interconnection lines 155c' and each of the gate lines SSL, WL1 to WLn, and GSL of the third cell string S3 may continuously penetrate the third, second, and first interlayer insulation layers 142, 140, and 130.

An upper interlayer insulation layer 160 may be disposed on the third interlayer insulation layer 142 and the third interconnection lines 155c'. The driving contact plug 165 may continuously penetrate the upper, third, second and first interlayer insulation layers 160, 142, 140, and 130 to contact the common landing conductive pattern 136.

The second interconnection lines 155b of FIG. 2 may be disposed at the same height as the first interconnection lines 155a, or disposed t the same height as the interconnection line 155c'. Alternatively, the second interconnection line 155b of FIG. 2 may be disposed higher than the third interconnection line 155c'.

Alternatively, the second interconnection lines 155b of FIG. 2 may be disposed at the same height as the driving gate lines DGL1 to DGL3, and the first and third interconnection lines 155a and 155c' may be disposed higher than the driving gate lines DGL1 to DGL3 and the second interconnection lines 155b of FIG. 2.

Figure 7:
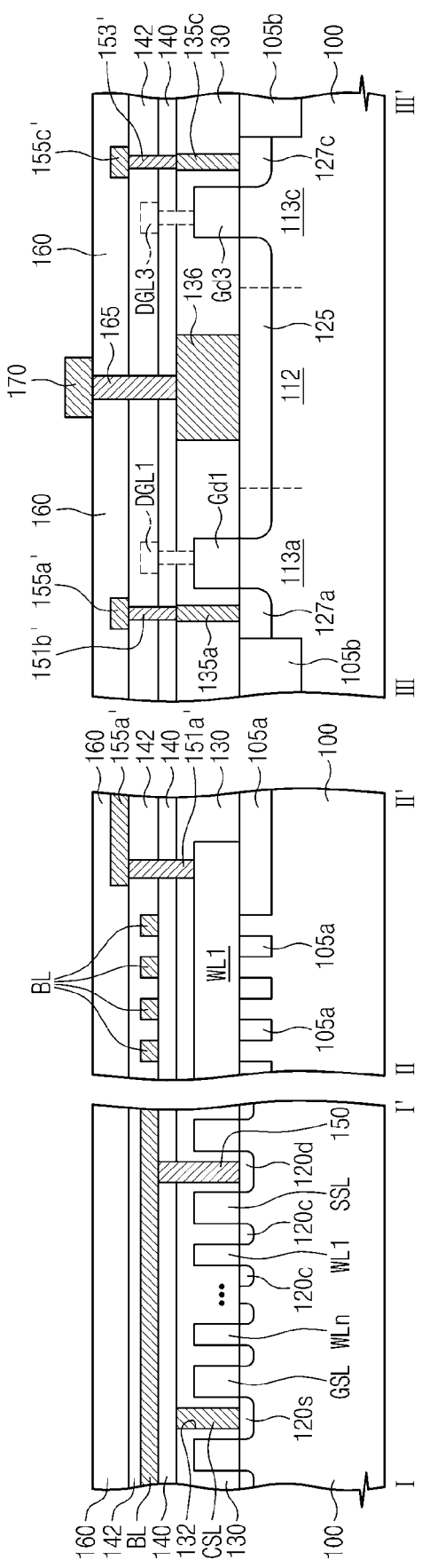
FIG. 7 is a cross-sectional view taken along lines of I-I', II-II', and III-III' of FIG. 2 illustrating another modification of the semiconductor device according to the first embodiment.

FIG. 7 is a cross-sectional view taken along lines of I-I', II-II', and III-III' of FIG. 2 illustrating another modification of the semiconductor device according to the first embodiment.

Referring to FIG. 7, according to this modification, the first to third interconnection lines may be disposed at a different height from the driving gate lines DGL1 to DGL3. Additionally, the first to third interconnection lines may be disposed at the same height. The driving gate lines DGL1 to DGL3 may be disposed on the second interlayer insulation layer 140, and the third interlayer insulation layer 142 may be disposed on the driving gate lines DGL1 to DGL3, the bit lines BL, and the second interlayer insulation layer 140. The first and third interconnection lines 155a' and 155c' may be disposed on the third interlayer insulation layer 142. A contact plug 151b' between the first interconnection line 155a' and the first landing conducive pattern 135a may continuously penetrate the third and second interlayer insulation layers 142 and 140. A contact plug 151a' between the first interconnection line 155a' and each of the gate lines SSL, WL1 to WLn, and GSL of the first cell string S1 may continuously penetrate the third, second, and first interlayer insulation layers 142, 140, and 130. The second interconnection lines 155b of FIG. 2 may be disposed on the same height as the first and third interconnection lines 155a' and 155c'.

Figure 8:
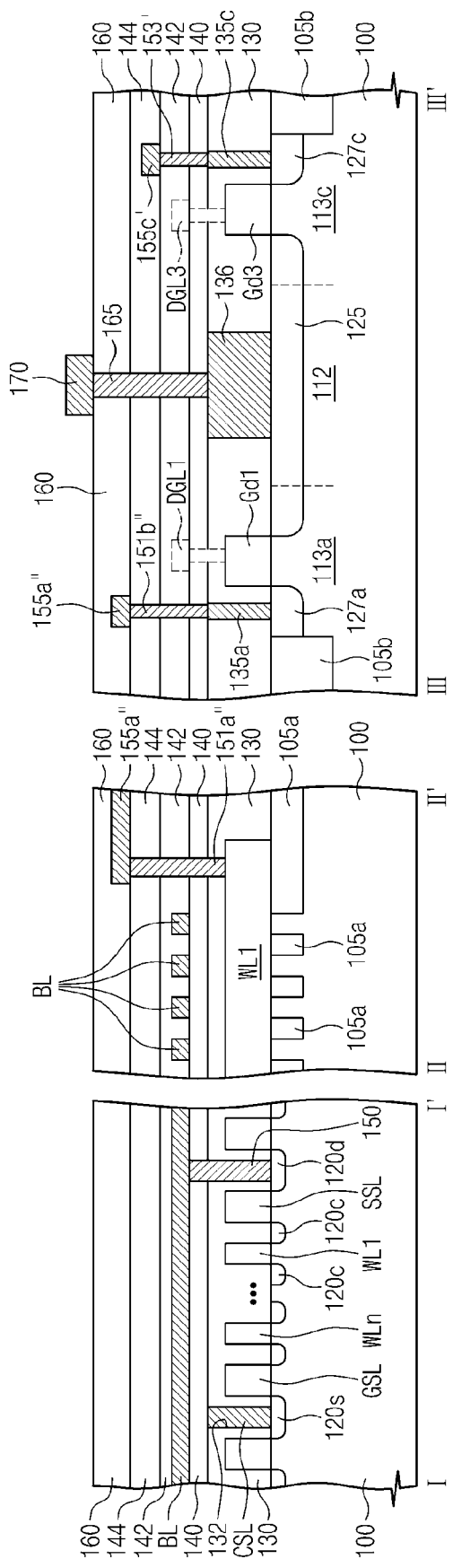
FIG. 8 is a cross-sectional view taken along lines of I-I', II-II', and III-III' of FIG. 2 illustrating another modification of the semiconductor device according to the first embodiment.

FIG. 8 is a cross-sectional view taken along lines of I-I', II-II', and III-III' of FIG. 2 illustrating another modification of the semiconductor device according to the first embodiment.

Referring to FIG. 8, according to this modification, all of the first to third interconnection lines may be disposed at a different height from the driving gate lines DGL1 to DGL3, and a portion of the first to third interconnection lines may be disposed at a different height from other portions of the first to third interconnection lines.

For example, the third interconnection line 155c' may be disposed on the third interlayer insulation layer 142. A fourth interlayer insulation layer 144 may be disposed on the third interconnection line 155c' and the third interlayer insulation layer 142. First interconnection lines 155a" may be disposed on the fourth interlayer insulation layer 144. A contact plug 151b" between the first interconnection line 155a" and the first landing conductive pattern 135a may continuously penetrate the fourth, third, and second interlayer insulation layers 144, 142, and 140. A contact plug 151a" between the first interconnection lines 155a" and each of the gate lines SSL, WL1 to WLn, and GSL of the first cell string S1 may continuously penetrate the fourth, third, second, and first interlayer insulation layers 144, 142, 140, and 130.

The second interconnection lines 155b of FIG. 2 may be disposed at the same height as the first interconnection line 155a", or may be disposed at the same height as the third interconnection line 155c'. Alternatively, the second interconnection lines 155b of FIG. 2 may be disposed at a different height from the first and third interconnection lines 155a" and 155c'.

Alternatively, the first and third interconnection line 155a" and 155c' are disposed at the same height and also at a different height from the driving gate lines DGL1 to DGL3. The second interconnection lines 155b of FIG. 2 may be disposed at a different height from the first and third interconnection lines 155a" and 155c' and the driving gate lines DGL1 to DGL3.

In the above-described semiconductor devices, the common source line CSL of the cell region 50 fills the grove 132 in the first interlayer insulation layer 130, and may directly contact the common sources 120s. Alternatively, the common source line CSL of the cell region 50 may have a different form. This will be described with reference to the drawings.

Figure 9:
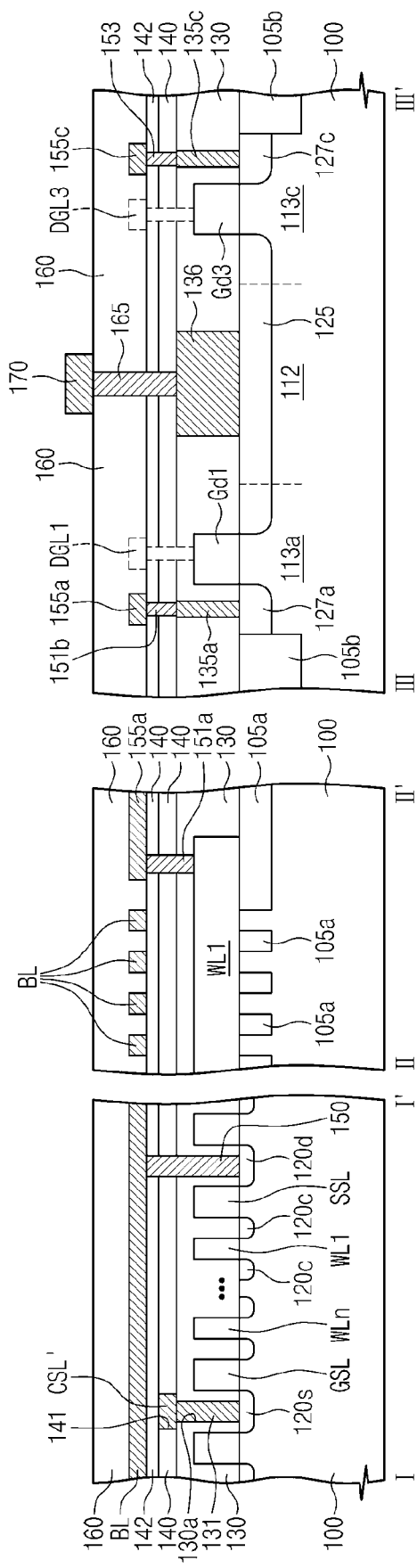
FIG. 9 is a cross-sectional view taken along lines of I-I', II-II', and III-III' of FIG. 2 illustrating another modification of the semiconductor device according to the first embodiment.

FIG. 9 is a cross-sectional view taken along lines of I-I', II-II', and III-III' of FIG. 2 illustrating another modification of the semiconductor device according to the first embodiment.

Referring to FIG. 9, a common source line CSL' may be disposed on the first interlayer insulation layer 130. The common source line CSL' may extend parallel to the second selection gate line GSL. The common source line CSL' may cover a plurality of common sources 120s. A common source plug 131 may be disposed between the common source line CSL' and each of the common sources 120s. The common source plug 131 may fill a contact hole 130a penetrating the first interlayer insulation layer 130. The common source plug 131 may be a pillar shape. That is, the one common source line CSL' may electrically contact the plurality of common sources 120s. A plurality of common source plugs 131a may be interposed between the plurality of common sources 120s and the common source line CSL', respectively.

The common source line CSL' may be disposed in the second interlayer insulation layer 140 above the first interlayer insulation layer 130. For example, the common source line CSL' may fill a groove 141 formed in the second interlayer insulation layer 140. Top surfaces of the common source line CSL' and the second interlayer insulation layer 140 may be coplanar.

Referring to FIGS. 2 and 9, the landing conductive patterns 135a, 135b, 135c and 136 of the driving circuit region 60 and the common source plug 131 may be formed of the same material.

A method of fabricating the landing conductive patterns 135a, 135b, 135c and 136, the common source plug 131, and the common source line CSL' will be described below. The landing conductive patterns 135a, 135b, 135c and 136 and the common source plug 131 may be simultaneously formed. Then, the second interlayer insulation layer 140 is formed to cover an entire surface of the substrate 100. The groove 141 may be formed in the second interlayer insulation layer 140 of the cell region 50, and then the common source line CSL' may be formed to fill the groove 141.

Alternatively, the common source plug 131 and the common source line CSL' may be formed through a dual damascene process. For example, the first and second interlayer insulation layers 130 and 140 may be sequentially formed, and then the contact hole 130a and the groove 141 may be formed. Next, a conductive layer may be formed to fill the contact hole 130 and the groove 141. The conductive layer may be planarized until the second interlayer insulation layer 140 is exposed, such that the common source plug 131 and the common source line CSL' may be formed. In this case, the landing conductive patterns 135a, 135b, 135c and 136 may continuously penetrate the second and first interlayer insulation layers 140 and 130. Top surfaces of the landing conductive patterns 135a, 135b, 135c and 136, the second interlayer insulation layer 140 and the common source line CSL' may be coplanar.

The third interlayer insulation layer 142 may be disposed on an entire surface of the substrate 100 including the second interlayer insulation layer 140 and the common source line CSL'. The bit line BL may be disposed on the third interlayer insulation layer 142, and the bit line plug 150 may continuously penetrate the third, second, and first interlayer insulation layers 142, 140, and 130 to contact the common drain 120d.

Referring to FIGS. 2 and 9, the first, second, and third interconnection lines 155a to 155c and the driving gate lines DGL1 to DGL3 may be disposed on the third interlayer insulation layer 142. Contact plugs below the lines 155a to 155c and DGL1 to DGL3 may further penetrate the third interlayer insulation layer 142, compared to the semiconductor device of FIG. 3. The elements of the semiconductor device of FIGS. 7 and 8 may be applied to the semiconductor device of FIG. 9. That is, referring to FIGS. 2 and 9, at least one of the first to third interconnection lines 155a to 155c and driving gate lines DGL1 to DGL3 may be disposed at a different height from the others thereof.

Figure 10:
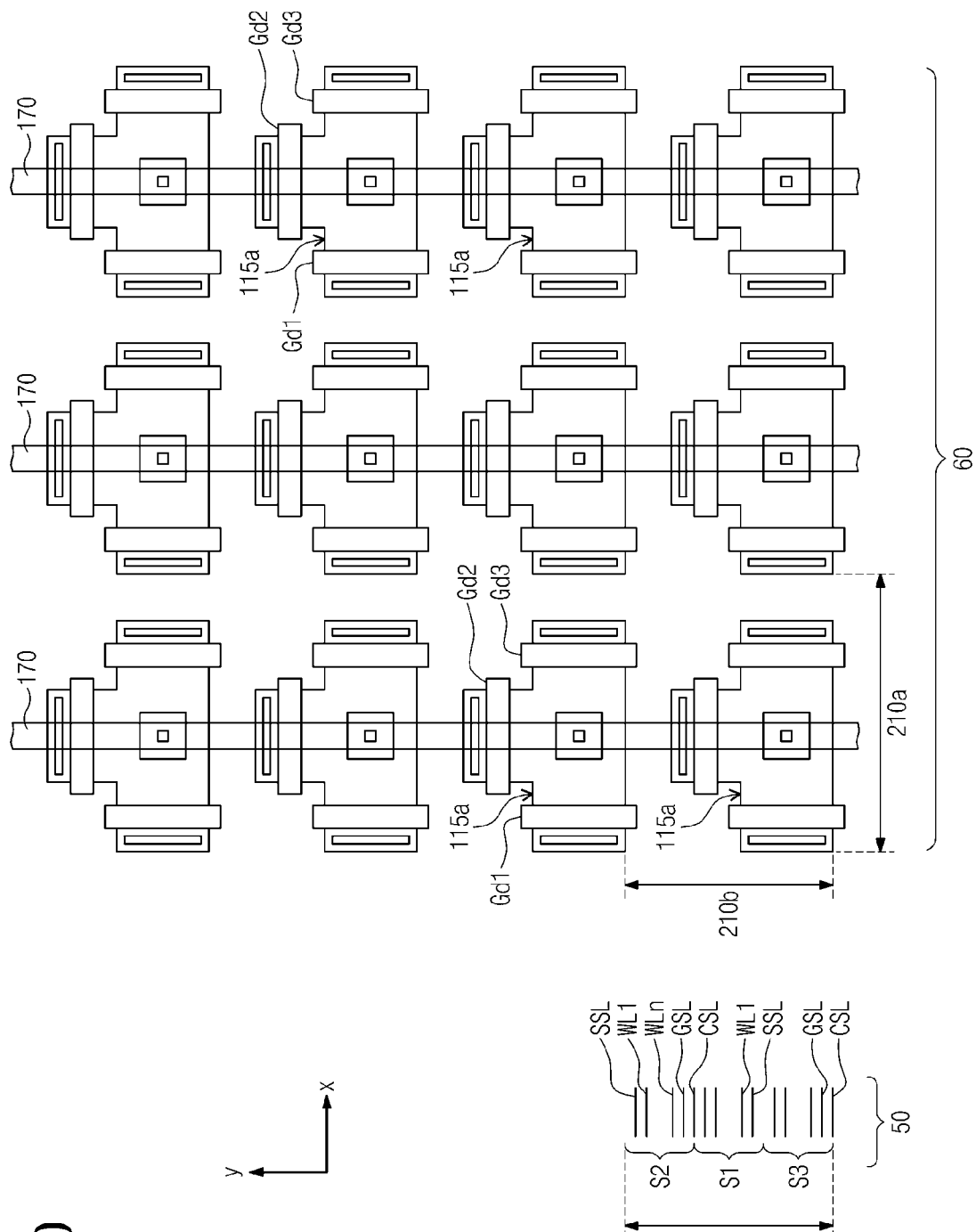
FIG. 10 is a plan view illustrating one arrangement of the driving active regions and the driving transistors in a semiconductor device according to one embodiment of the present invention.

FIG. 10 is a plan view illustrating one arrangement of the driving active regions and the driving transistors in a semiconductor device according to one embodiment of the present invention.

Referring to FIG. 10, a plurality of driving active regions 115a in a driving circuit region 60 may be arranged two-dimensionally to form a plurality of rows and a plurality of columns. The driving active regions 115a in each row may be arranged with a row pitch 210a along a first direction (i.e., an x-axis direction), and the driving active regions 115a in each column may be arranged with a column pitch 210b along a second direction (i.e., a y-axis direction).

A plurality of cell string groups corresponding to the plurality of rows may be arranged in the cell region 50 along the second direction. Each cell string group may include a first cell string S1, a second cell string S2, and a third cell string S3. The first to third cell strings S1 to S3 in each cell string group may be coupled to the first to third driving transistors of the driving active regions 115a in each row as illustrated in FIGS. 1 through 9. The gate lines SSL, WL1 to WLn, and GSL of the strings S1 to S3 extend along the first direction. That is, the first direction may be longitudinal directions of the gate lines SSL, WL1 to WLn, and GSL.

The common source/drains formed in the driving active regions 115a of each column may electrically contact one driving line 170. Accordingly, a plurality of driving lines 170 that contact the columns, respectively, may be laterally arranged in the driving circuit region 60.

The column pitch 210b may be identical to or less than a length 205 in the second direction of each cell string group (i.e., the first to third cell strings S1 to S3). In particular, the column pitch 210b may be the same as the length 205 in the second direction of the cell string group.

The driving active regions 115a may be arranged in another form. This will be described with reference to the drawings.

Figure 11:
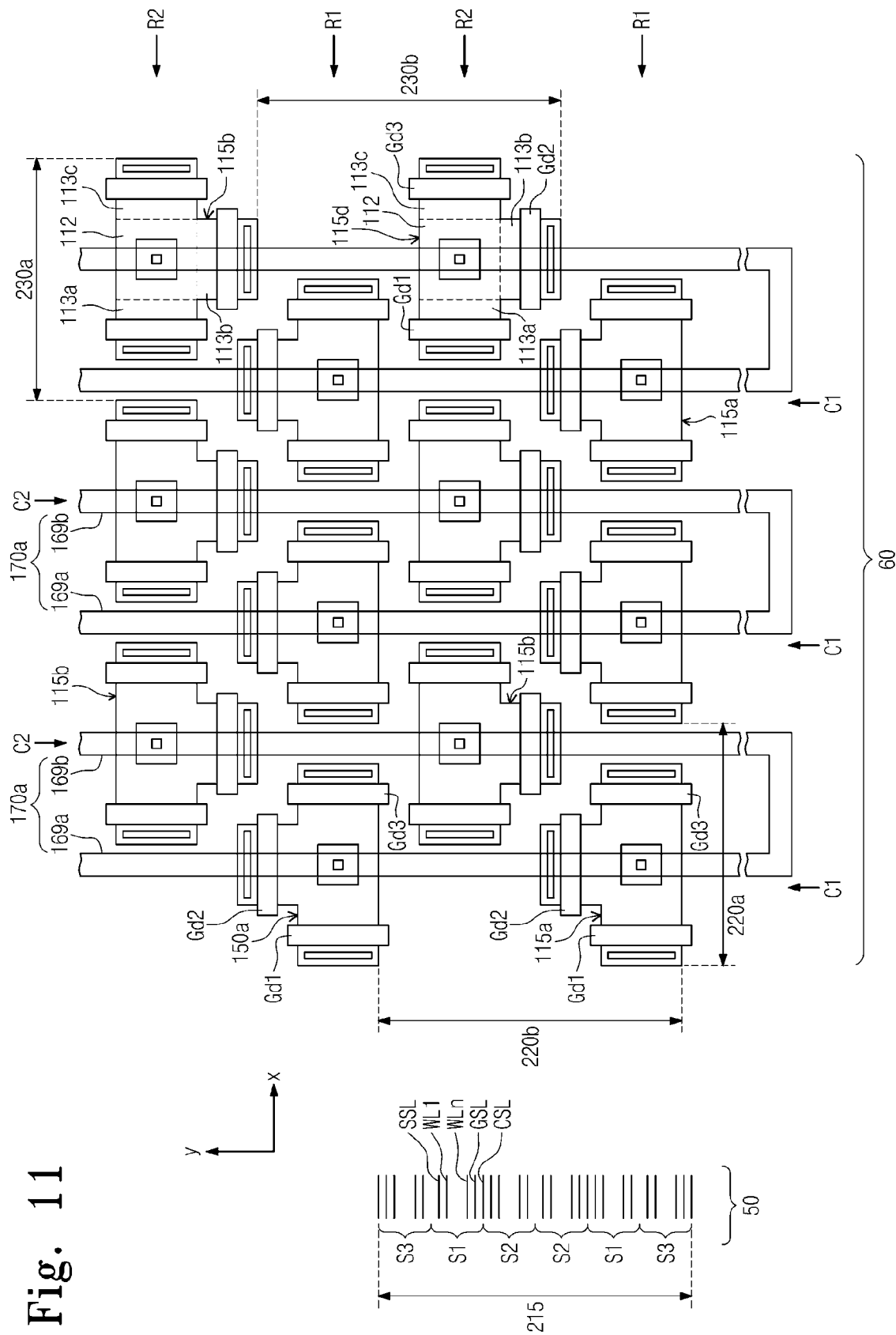
FIG. 11 is a plan view illustrating another arrangement of the driving active regions and the driving transistors in a semiconductor device according to one embodiment of the present invention.

FIG. 11 is a plan view illustrating another arrangement of the driving active regions and the driving transistors in a semiconductor device according to one embodiment of the present invention.

Referring to FIG. 11, a plurality of first driving active regions 115a in the driving circuit region 60 are arranged two-dimensionally to form a plurality of first rows R1 and a plurality of first columns C1. A plurality of second driving active regions 115b in the driving circuit region 60 are arranged two-dimensionally to form a plurality of second rows R2 and a plurality of second columns C2. The first columns C1 and the second columns C2 are alternately arranged along the first direction (x-axis direction), and the first rows R1 and the second rows R2 are alternately arranged along the second direction (y-axis direction).

The first driving active regions 115a in each first row R1 are arranged with a first row pitch 220a along the first direction, and the first driving active regions 115a in each first column C1 are arranged with a first column pitch 220b along the second direction. The second driving active regions 115b in each second row R2 are arranged with a second row pitch 230a along the first direction, and the second driving active regions 115b in each second column C2 are arranged with a second column pitch 230b along the second direction. The first row pitch 220a and the second row pitch 230a may be the same. The first column pitch 220b and the second column pitch 230b may be the same.

Each second driving active region 115b may include a common portion 112 and the first, second and third branch portions 113a, 113b and 113c extending from the common portion 112. A first, second and third driving gate patterns Gd1, Gd2 and Gd3 may cross over the first, second and third branch portions 113a, 113b and 113c of the second driving active region 115b, respectively. A common source/drain may be formed in the common portion 112 of each second driving active region 115b and first, second and third individual source/drains are formed in the first, second and third branch portions 113a, 113b and 113c in each second driving active region 115b, respectively. The first branch portion 113a, the common portion 112, and the third branch portion 113c in each second driving active region 115b may be sequentially arranged along the first direction. The first direction may be longitudinal directions of the gate lines SSL, WL1 to WLn, and GSL in the cell region 50. The second branch portion 113b and the common portion 112 in each second driving active region 115b may be sequentially formed along the second direction.

In the adjacent first row R1 and the second row R2, the second branch portions 113b of the first driving active regions 115a in the first row R1 may extend toward the second row R2, and the second branch portions 113b of the second driving active regions 115b in the second row R2 may extend toward the first row R1. The second branch portions 113b of the first row R1 and the second branch portions 113b of the second row R2, which are adjacent to each other, may overlap in the first direction. Therefore, the a first interval between a pair of the adjacent first driving active regions 115a, a second interval between a pair of the adjacent second driving active regions 115b, and a third interval between adjacent first and second driving active regions 115a and 115b may be substantially identical. Of course, even if the second branch portions 113b of the first row R1 and the second branch portions 113b of the second row R2, which are adjacent to each other, may overlap in the first direction, they are spaced apart from each other.

The cell string groups that respectively correspond to the first rows R1 and the second rows R2 in the cell region 50 may arranged in the second direction. The number of the cell string groups may be the sum of the number of the first rows R1 and the number of the second rows R2. Each cell string group may include a first cell string S1, a second cell string S2, and a third cell string S3.

The first column pitch 220b may be identical to or less than the length 215 in the second direction of a pair of adjacent cell string groups. In particular, the first column pitch 220b may be the same as the length 215 of the pair of cell string groups.

The common source/drains formed in the first and second driving active regions 115a and 115b in the first column C1 and second column C2 adjacent to each other may be electrically connected to one driving line 170a. Accordingly, the number of the first columns C1 may be identical to the number of second columns C2. Additionally, the number of the first columns C1 may be identical to the number of the driving lines 170a. The driving line 170a may include a first line portion 169a and a second line portion 169b. The first line portion 169a is electrically connected to the common source/drains in the first column C1, and the second line portion 169b is electrically connected to the common source/drains in the second column C2. Adjacent one end of the first line portion 169a and one end of the second line portion 169b may be connected to each other. Therefore, the common source/drains of the adjacent first column C1 and the second column C2 may be electrically connected to the driving line 170a. At least one of the other ends of the first and second line portions 169a and 169b may be electrically connected to a high voltage supplying unit. If one of the other ends of the first and second line portions 169a and 169b is electrically connected to the high voltage supplying unit, the other one may float.

The driving line 170a may have another form. This will be described with reference to the drawings.

Figure 12:
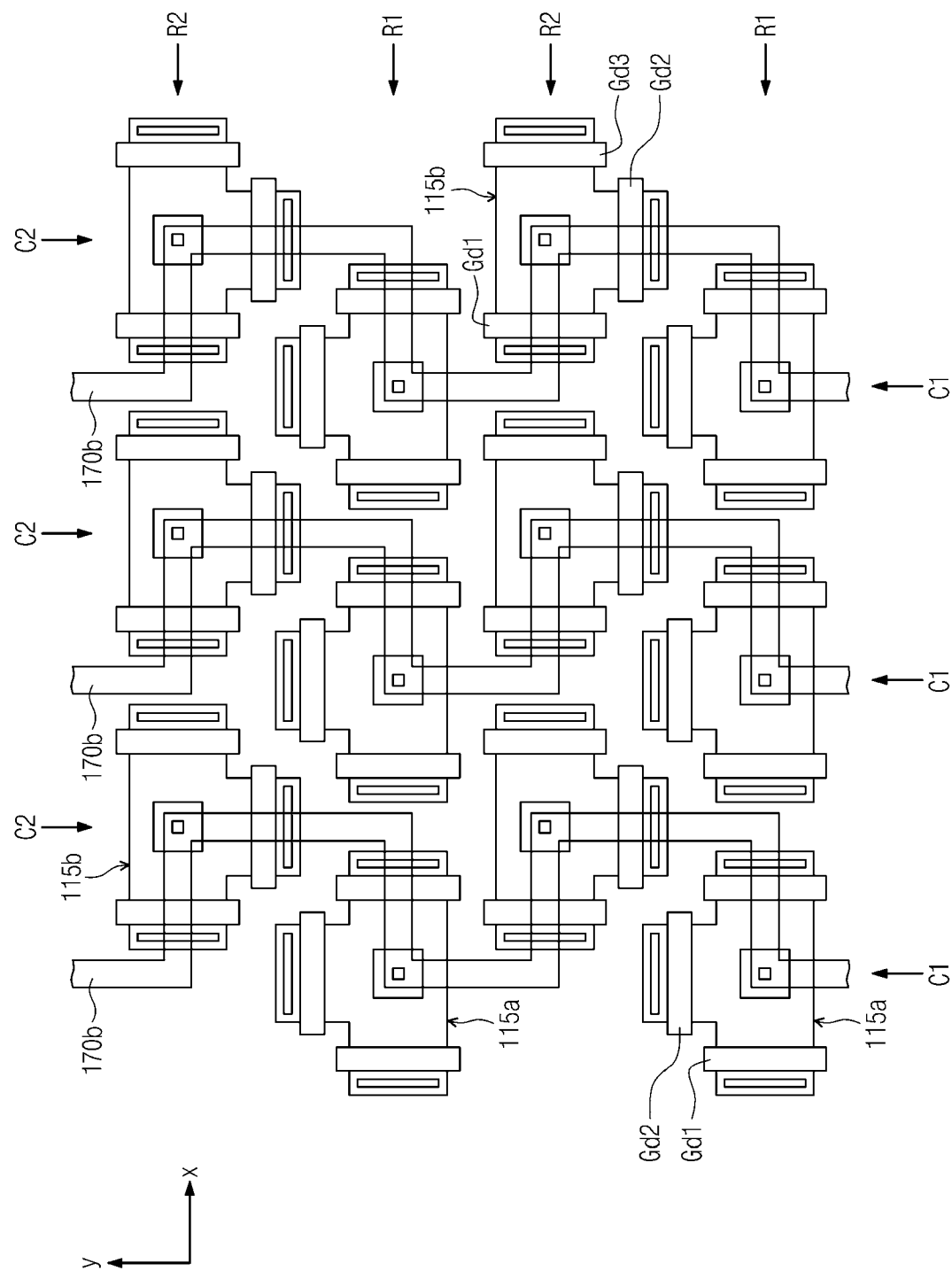
FIG. 12 is a plan view illustrating a modification of a driving line in the semiconductor device of FIG. 11.

FIG. 12 is a plan view illustrating a modification of a driving line in the semiconductor device of FIG. 11.

Referring to FIG. 12, one driving line 170b is electrically connected to the common source/drains in the first column C1 and second column C2 adjacent to each other. The driving line 170b may directly cross over the source/drains of the first and second driving active regions 115a and 115b adjacent to each other. The driving line 170b may extend with a zigzag form in the second direction.

Figure 13:
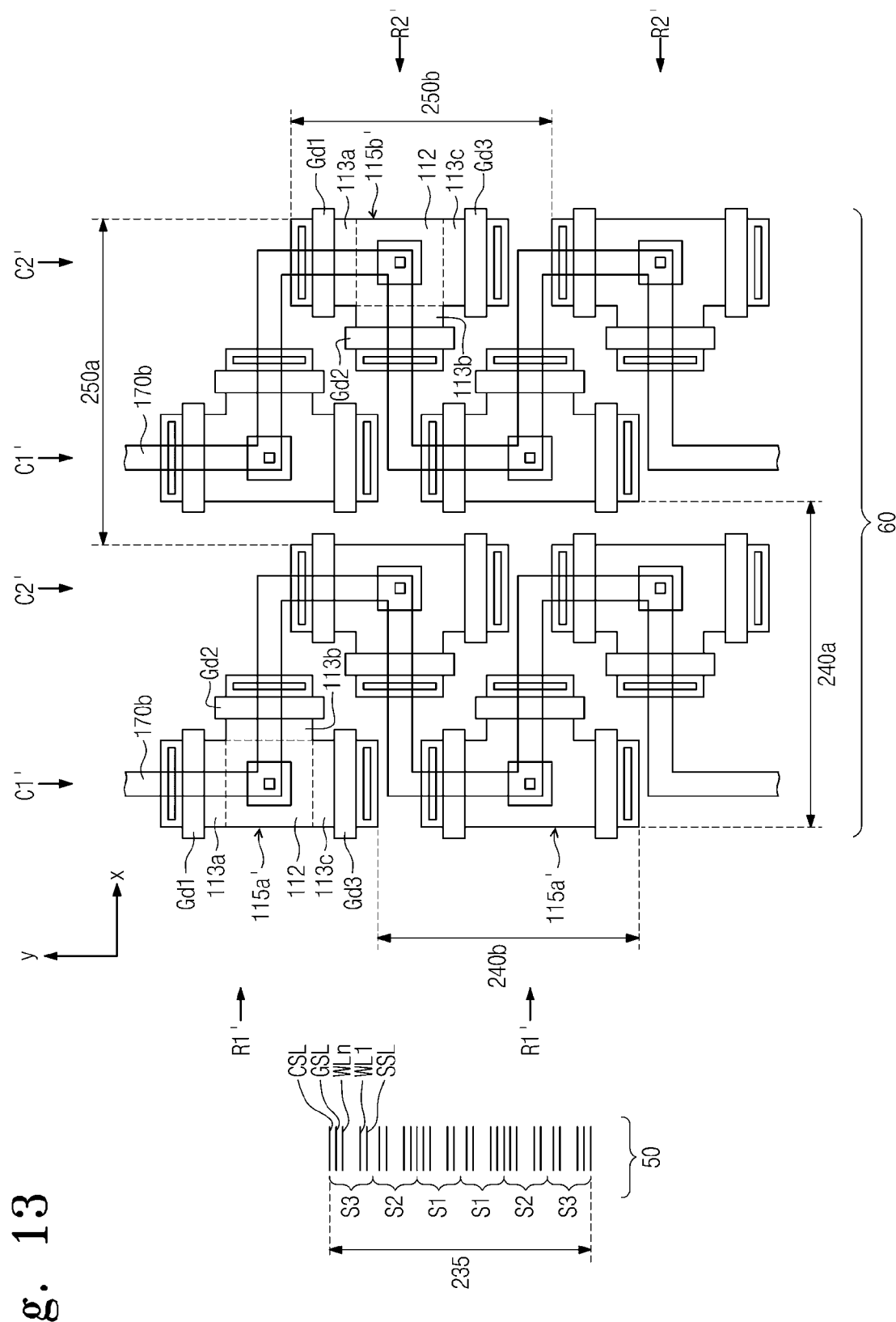
FIG. 13 is a plan view illustrating another arrangement of the driving active regions and the driving transistors in a semiconductor device according to one embodiment of the present invention.

FIG. 13 is a plan view illustrating another arrangement of the driving active regions and the driving transistors in a semiconductor device according to one embodiment of the present invention.

Referring to FIG. 13, first driving active regions 115a' in the driving circuit region 60 may be two-dimensionally arranged to form a plurality of first rows R1' and a plurality of first columns C1', and second driving active regions 115b' may be two-dimensionally arranged to form a plurality of second rows R2' and a plurality of second columns C2'. The first columns C1' and the second columns C2' are alternately arranged in the first direction (x-axis direction) and the first rows R1' and second rows R2' are alternately arranged in the second direction (y-axis direction).

The first driving active regions 115a' in each first row R1' is arranged with a first row pitch 240a along the first direction (x-axis direction) and the first driving active regions 115a' in each first column C1' is arranged with a first column pitch 240b along the second direction (y-axis direction). The second driving active regions 115b' in the second row R2' are arranged with a second row pitch 250a along the first direction and the second driving active regions 115b in each second column C2' are arranged with a second column pitch 250b along the second direction.

Each of the first driving active region 115a' and the second driving active region 115b' include a common portion 112, and first, second and third branch portions 113a, 113b and 113c extending from the common portion 112. First, second and third driving gate patterns Gd1, Gd2 and Gd3 cross over the first, second and third branch portions 113a, 113b and 113c, respectively. The common source/drain is formed in the common portion 112, and the first, second and third individual source/drains are formed in the first, second and third branch portions 113a, 113b and 113c, respectively.

The first branch potion 113a, the common portion 112, and the third branch portion 113c of each first driving active region 115a' may be sequentially arranged in the second direction and the second branch portion 113b and the common portion 112 of each first driving active region 115a' may be arranged in the first direction. The first direction may be the longitudinal directions of the gate lines SSL, WL1 to WLn, and GSL in the cell region 50. The first branch portion 113a, the common portion 112, and the third branch portion 113c of each second driving active region 114b' may be sequentially arranged in the second direction and the second branch portion 113b and the common portion 112 of the second driving active region 115b' may be arranged in the first direction. In the first column C1' and the second column C2' adjacent to each other, the second branch portions 113b of the first column C1' may extend toward the second column C2', and the second branch portions 113b of the second column C2' may extend toward the first column C1'. The adjacent second branch portion 113b of the first column C1' and the second branch portions 113b of the second column C2' may overlap in the second direction.

The common source/drains of the first column C1' and the second column C2' adjacent to each other may be electrically connected to one driving line 170b. The driving line 170b may be changed into the form of the driving line 170a of FIG. 11.

The first column pitch 240b may be identical or less than the length 235 in the second direction of the six cell strings S1, S2, S3, S1, S2, and S3 adjacent to each other in the cell region 50.

Second Embodiment

A semiconductor device according to this embodiment may be more highly integrated. For example, four driving transistors, connected in parallel, may be formed at one driving active region. Like reference numerals refer to like elements throughout the first and second embodiments.

Figure 14:
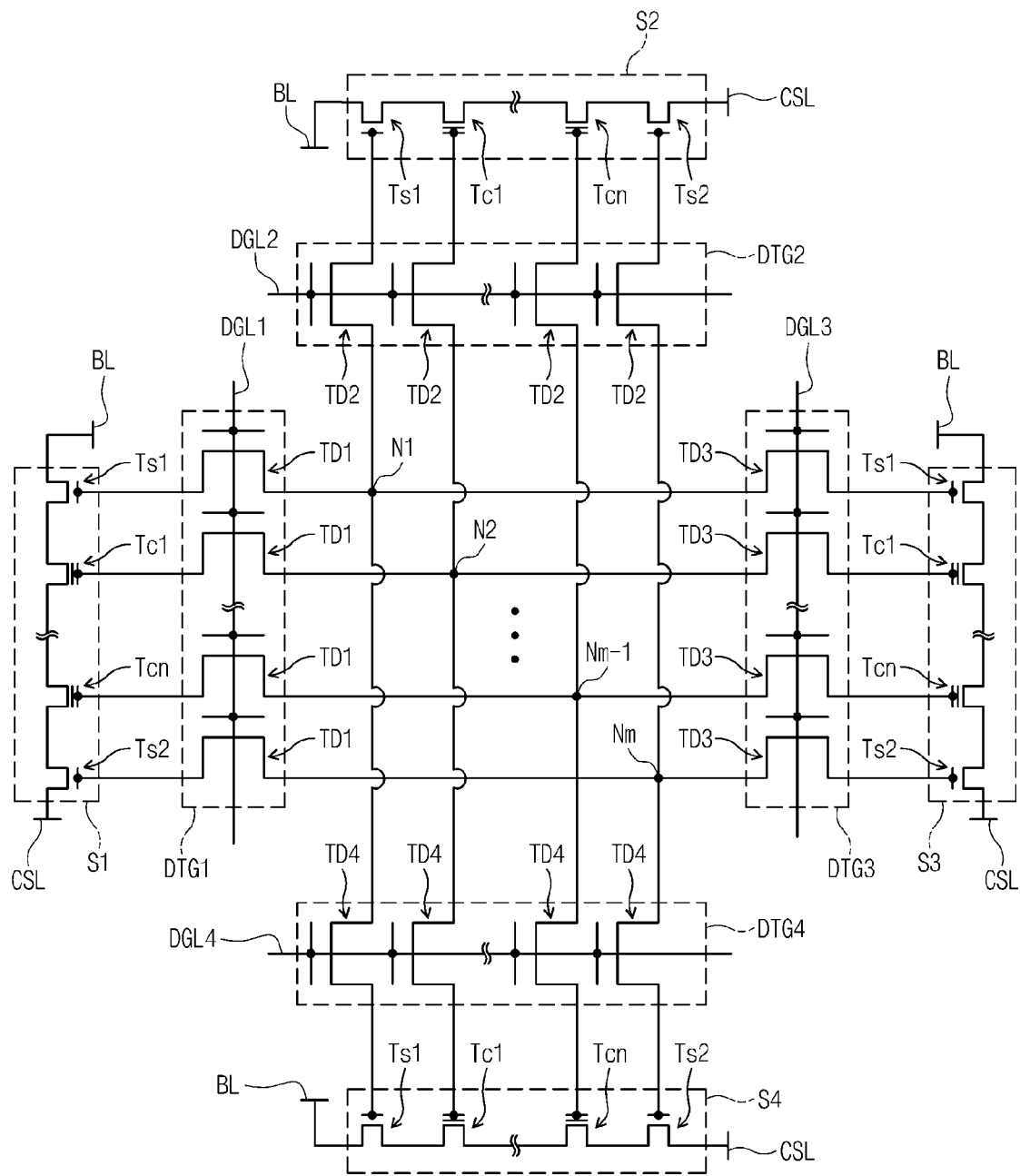
FIG. 14 is an equivalent circuit diagram illustrating a semiconductor device according to another embodiment of the present invention.

FIG. 14 is an equivalent circuit diagram illustrating a semiconductor device according to another embodiment of the present invention.

Referring to FIG. 14, a semiconductor device may include a first driving transistor group DTG1, a second driving transistor group DTG2, a third driving transistor group DTG3, and a fourth driving transistor group DTG4, and a first cell string S1, a second cell string S2, a third cell string S3, and a fourth cell string S4 corresponding to the first to fourth driving transistor groups DTG1 to DTG4. Detailed description of the first to third cell strings S1 to S3 will not be repeated since they are described above with reference to FIG. 1. The fourth cell string S4 may have the same structure as the first to third cell strings S1 to S3. That is, the fourth cell string S4 may include a first selection transistor Ts1, a plurality of cell transistors Tc1 to Tcn, and a second selection transistor Ts2. Detailed description of the first to third driving transistor groups DTG1 to DTG3 will not be repeated since they are described above with reference to FIG. 1. The fourth driving transistor group DTG4 may include a plurality of fourth driving transistors TD4 that correspond to the first selection transistor Ts1, the plurality of cell transistors Tc1 to Tcn, and the second selection transistor Ts2 of the fourth cell string S4, respectively. Gates of the plurality of fourth driving transistors TD4 may be electrically connected to one fourth driving gate line DGL4. The first to fourth driving gate lines DGL1 to DGL4 may be independently controlled.

First source/drains of the fourth driving transistors TD4 may be electrically connected to gates of the first selection transistor Ts1, gates of the cell transistors Tc1 to Tcn, and a gate of the second selection transistor Ts2 in the fourth cell string S4, respectively. Second source/drains of the fourth driving transistors TD4 may be electrically connected to the plurality of nodes N1 to Nm, respectively. As illustrated in FIG. 1, the nodes N1 to Nm are electrically connected to the second source/drains of the first to third driving transistors TD1 to TD3, respectively. Therefore, the nodes N1 to Nm are electrically connected to the second source/drains of the first to fourth driving transistors TD1 to TD4, respectively. The first to fourth driving transistors TD1 to TD4 may be connected in parallel by the nodes N1 to Nm. The fourth driving transistors TD4 may control a high voltage higher than a supply voltage like the first to third driving transistors TD1 to TD3.

According to the above described semiconductor device, the four driving transistors TD1 to TD4 are connected in parallel to each other by each of the nodes N1 to Nm. Therefore, the first to fourth driving transistors TD1 to TD4 connected to each of the nodes N1 to Nm may share one common source/drain. As a result, areas of the first to fourth driving transistors TD1 to TD4 can be reduced to realize a more highly integrated semiconductor device.

Next, the semiconductor device realized according to this embodiment will be described in more detail with reference to FIGS. 15 and 16.

Figure 15:
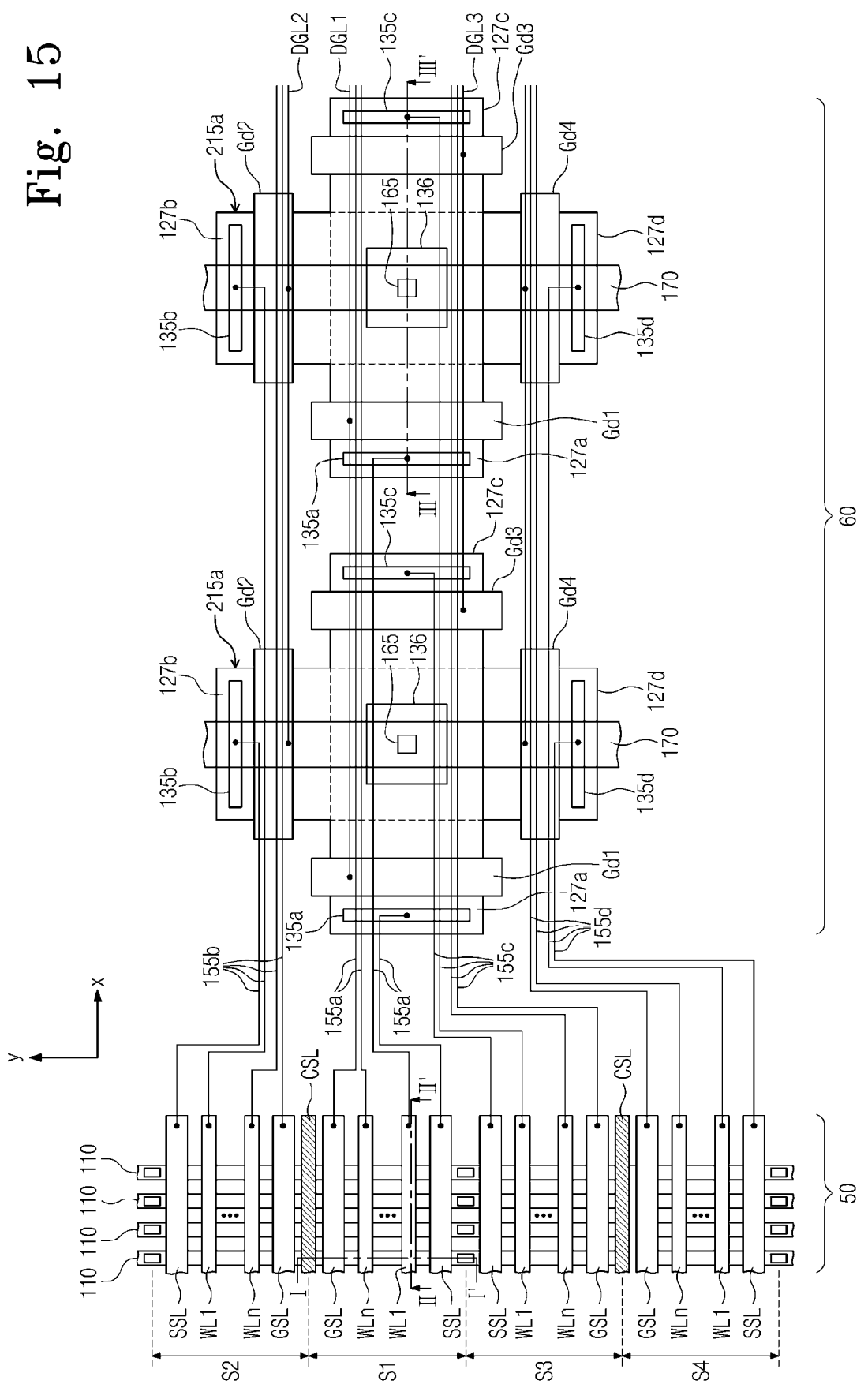
FIG. 15 is a plan view illustrating a semiconductor device according to another embodiment of the present invention.
Figure 16:
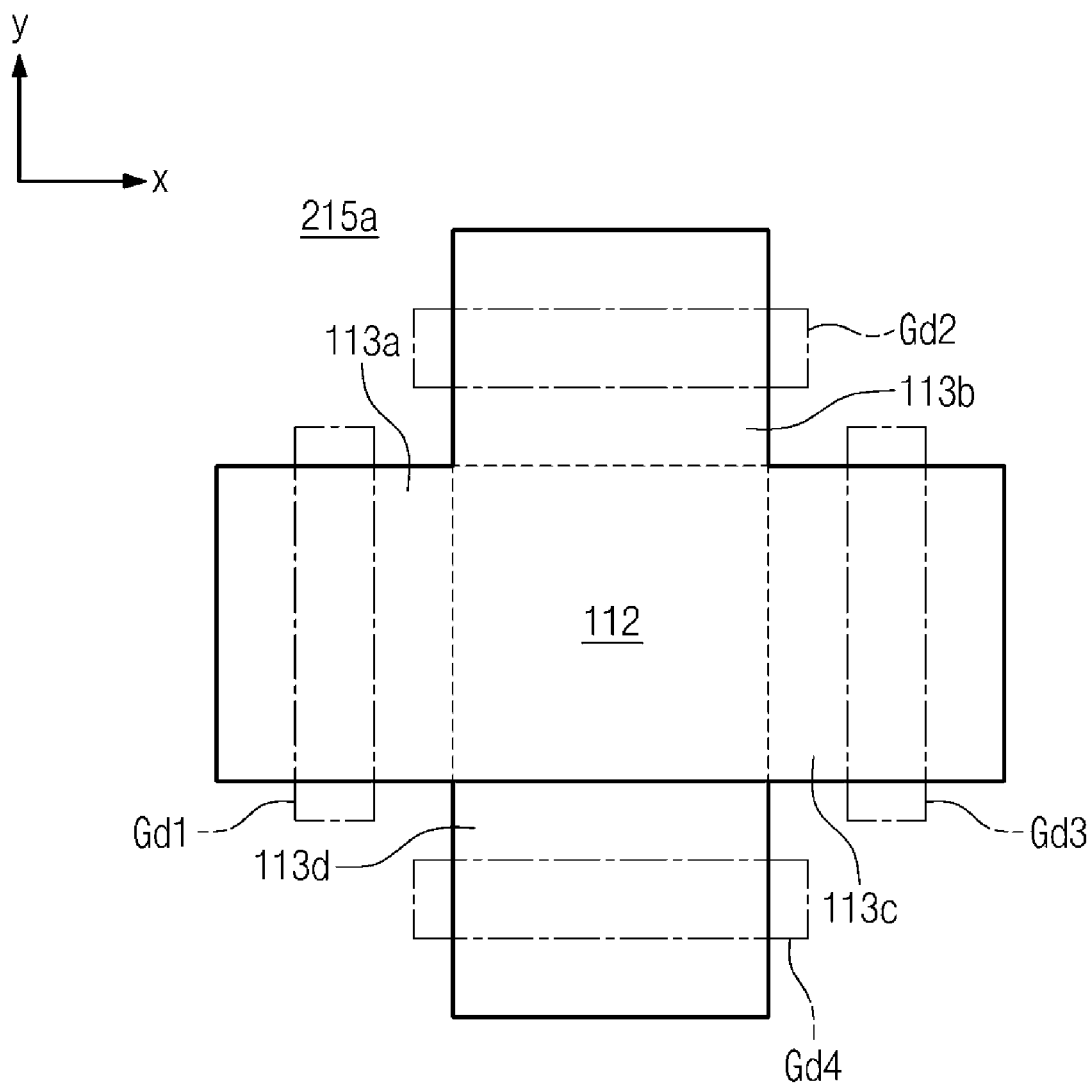
FIG. 16 is a plan view illustrating a driving active region of FIG. 15.

FIG. 15 is a plan view illustrating a semiconductor device according to another embodiment of the present invention, and FIG. 16 is a plan view illustrating a driving active region of FIG. 15.

Referring to FIGS. 15 and 16, a plurality of cell active regions 110 may be defined by a first device isolation pattern disposed on a substrate 100 in a cell region 50. Additionally, a plurality of driving active regions 215a may be defined by a second device isolation pattern disposed on the substrate 100 in a driving circuit region 60. Driving transistors in the driving active regions 215a can control a high voltage higher than a supply voltage. Accordingly, the second device isolation pattern can be formed deeper than the first device isolation pattern. The driving active region 215a may be a portion of the substrate 100 surrounded by the second device isolation pattern.

The plurality of the driving active regions 215a may be arranged in a first direction (i.e., an x-axis direction) in the driving circuit region 60 to form one row. Each driving active region 215a may include a common portion 112, first, second, third and fourth branch portions 113a, 113b, 113c and 113d that extend from the common portion and are spaced apart from each other. The first to fourth branch portions 113a to 113d may extend from the mutually different sides of the common portion 112. The common portion 112 and the first to fourth branch portions 113a to 113d may directly contact each other.

The first branch portion 113a, the common portion 112, and the third branch portion 113c may be sequentially arranged in the first direction, and the second branch portion 113b, the common portion 112, and the fourth branch portion 113d may be sequentially arranged in a second direction (i.e., a y-axis direction) perpendicular to the first direction. For example, each driving active region 215a may have a cross form. First, second, third and fourth driving gate patterns Gd1, Gd2, Gd3 and Gd4 may cross over the first, second, third and fourth branch portions 113a, 113b, 113c and 113d in each driving active region 215a, respectively. The first and third driving gate patterns Gd1 and Gd3 may extend parallel to each other in the second direction. The second and fourth driving gate patterns Gd2 and Gd4 may extend parallel to each other in the first direction. Each of the driving gate patterns Gd1, Gd2, Gd3 and Gd4 may include a driving gate insulation layer and a driving gate electrode, which are sequentially stacked.

A common source/drain is disposed in the common portion 112, and first, second, third and fourth individual source/drains 127a, 127b, 127c and 127d are formed in the first, second, third and fourth branch portions 113a, 113b, 113c and 113d, respectively. The first to fourth individual source/drains 127a, 127b, 127c and 127d are spaced apart from each other and are spaced apart from the common source/drain. The common source/drain may correspond to each of the nodes N1 to Nm of FIG. 14, and the first to fourth individual source/drains 127a, 127b, 127c and 127d may correspond to the first source/drains of the first to fourth driving transistors TD1 to TD4 of FIG. 14. When the driving gate patterns Gd1 to Gd4 are spaced apart from the common portion 112, the common source/drain may extend in the first to fourth branch portions 113a to 113d between the driving gate patterns Gd1 to Gd4 and the common portion 112. The fourth driving gate pattern Gd4, the fourth individual source/drain 127d, and the common source/drain constitute the fourth driving transistor of FIG. 14.

First, second, third and fourth landing conductive patterns 135a, 135b, 135c and 135d may be disposed on the first, second, third and fourth individual source/drains 127a, 127b, 127c and 127d, respectively. The fourth landing conductive patterns 135d may have a bar shape extending parallel to the fourth driving gate pattern Gd4.

First, second, third and fourth cell strings S1, S2, S3 and S4 may be disposed in the cell region 50. The first, second, third and fourth cell strings S1, S2, S3 and S4 may correspond to the first, second, third and fourth driving transistors, respectively. Gates lines SSL, WL1 to WLn, and GSL of the cell strings S1 to S4 cross over the cell active regions 110. The gate line SSL, WL1 to WLn, and GSL of the fourth cell string S4 may have the same structure as the gate lines SSL, WL1, . . . , WLn, GSL of the first cell string S1. The fourth cell string S4 is symmetric to the third cell string S3 with respect to the common source line CSL.

First, second and third interconnection lines 155a, 155b and 155c corresponding to the first, second and third cell strings S1, S2 and S3 may be disposed in the driving circuit region 60. The gate lines SSL, WL1 to WLn, and GSL of the fourth cell string S4 may be electrically connected to the fourth individual source/drains 127d in the row, respectively, by fourth interconnection lines 155d. The fourth interconnection lines 155d may be electrically connected to the fourth individual source/drains via the fourth landing conductive patterns 127d. A fourth driving gate line DGL4 is electrically connected to the fourth driving gate patterns Gd4 in the row. The fourth driving gate line DGL4 and the first, second and third driving gate lines DGL1, DGL2 and DGL3 may be individually controlled.

The driving gate lines DGL1 to DGL4 and the interconnection lines 155a to 155d may be disposed at the same height from the top surface of the substrate 100. Alternatively, at least one of the driving gate lines DGL1 to DGL4 and the interconnection lines 155a to 155d may be disposed at a different height from the others of the driving gate lines DGL1 to DGL4 and the interconnection lines 155a to 155d. For example, at least one of the interconnection lines 155a to 155d may be disposed at the same height as the driving gate lines DGL1 to DGL4. The others of the interconnection lines 155a to 155d may be disposed at a different height from the driving gate lines DGL1 to DGL4. Alternatively, the driving gate lines DGL1 to DGL4 may be disposed at a different height from the interconnection lines 155a to 155d. Alternatively, the first and third interconnection lines 155a and 155c may be disposed at a first height, and the second and fourth interconnection lines 155b and 155d may be disposed at a second height. In this case, the first height and second height are different from each other. The present invention is not limited thereto. The driving gate lines DGL1 to DGL4 and the interconnection lines 155a to 155d may be disposed at the various heights and/or positions according to a demand for a semiconductor device.

According to the above-described semiconductor device, the four driving transistors are formed in one driving active region 215a. The four driving transistors share one common source/drain formed in the one driving active region 215a. Accordingly, the semiconductor device can be more highly integrated.

Figure 17:
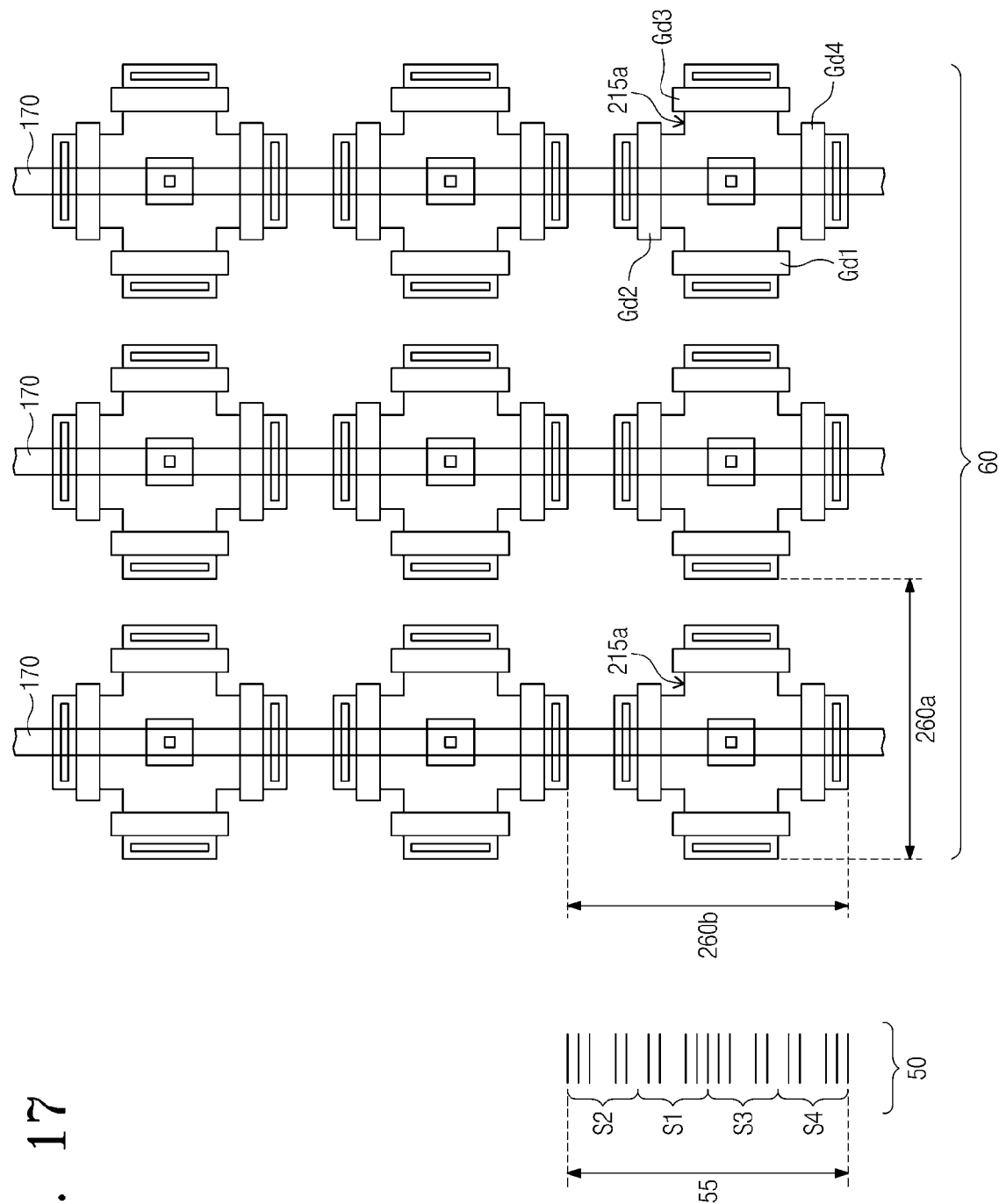
FIG. 17 is a plan view illustrating one arrangement of driving active regions included in a semiconductor device according to another embodiment of the present invention.

FIG. 17 is a plan view illustrating one arrangement of driving active regions included in a semiconductor device according to another embodiment of the present invention.

Referring to FIG. 17, a plurality of driving active regions 215a may be two-dimensionally arranged in a driving circuit region 60 to form a plurality of rows and a plurality of columns. The driving active regions 215a in each row may be arranged with a row pitch 260a along a first direction (i.e., an x-axis direction). The driving active regions 215a in each column may be arranged with a column pitch 260b along the second direction (i.e., a y-axis direction). One driving line 170 may be electrically connected to the common source/drains formed in the driving active regions 215a in each column.

A plurality of cell string groups corresponding to the rows, respectively, may be disposed in the cell region 50. Each cell string group may include the first, second, third and fourth cell strings S1, S2, S3 and S4. The cell string groups may be arranged in the second direction. The column pitch 260b may be identical or less than a length 255 in the second direction of the first, second, third and fourth cell strings S1, S2, S3 and S4 adjacent to each other.

The driving active regions 215a of the semiconductor device according to this embodiment may be arranged in a different form. This will be described with reference to FIG. 18.

Figure 18:
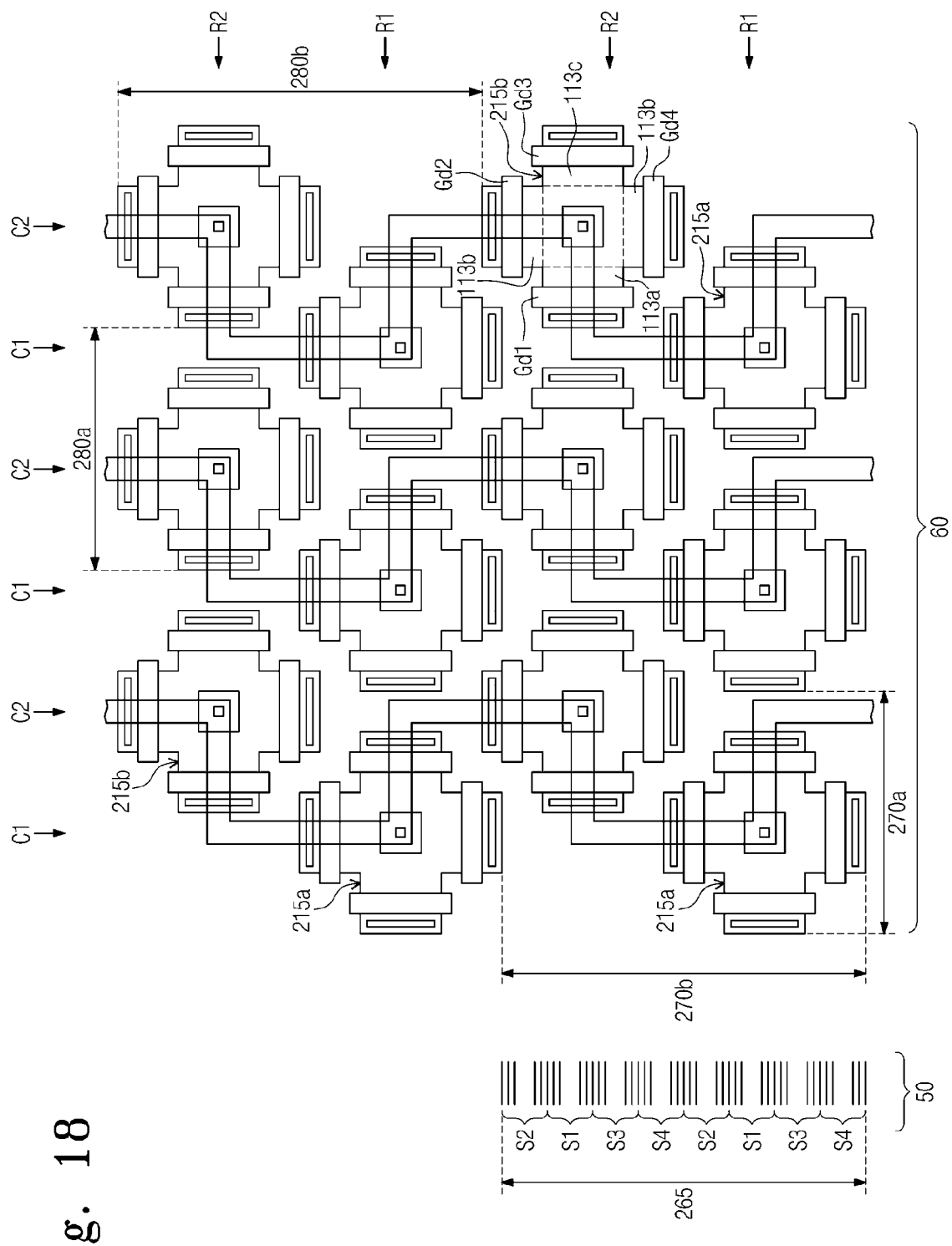
FIG. 18 is a plan view illustrating another arrangement of driving active regions included in a semiconductor device according to another embodiment of the present invention.

FIG. 18 is a plan view illustrating another arrangement of driving active regions included in a semiconductor device according to another embodiment of the present invention.

Referring to FIG. 18, a plurality of first driving active regions 215a are two-dimensionally arranged in a driving circuit region 60 to form a plurality of first rows R1 and a plurality of first columns C1. A plurality of second driving active regions 215b are two-dimensionally arranged in the driving circuit region 60 to form a plurality of second rows R2 and a plurality of second columns C2. The first driving active regions 215a in each first row R1 may be arranged with a first row pitch 270a along the first direction. The first driving active regions 215a in each first column C1 may be arranged with a first column pitch 270b along the second direction. The second driving active regions 215b in each second row R2 may be arranged with a second row pitch 280a along the first direction. The second driving active regions 215b in each second column C2 may be arranged with a second column pitch 280b along the second direction. The first row pitch 270a and the second column pitch 280a may be the same. The first column pitch 270b and the second column pitch 280b may be the same. The first columns C1 and the second columns C2 may be alternately arranged along the first direction and the first rows R1 and the second rows R2 may be alternately arranged along the second direction.

The second driving active region 215b may have the same structure as the first driving active region 215b. The first driving active region 215a may have a symmetric structure in the up and down and left and right directions with respect to a center point of the first driving active region 215a. The second branch portions 113b of the first row R1 may overlap the fourth branch portions 113b of the second row R2 adjacent to the one side of the first row R1, in the first direction. In the same manner, the fourth branch portions 113b of the first row R1 may overlap the second branch portions 113b of the second row R2 adjacent to the other side of the first row R1, in the first direction. The first and second driving active regions 215a and 215b may be spaced apart from each other.

One driving line 170b may be electrically connected to the common source/drains in the first column C1 and second column C2 adjacent to each other. The driving line 170b may extend with a zigzag form in the second direction. Alternatively, the driving line 170b may have the same form as the driving line 170a of FIG. 11.

A plurality of cell string groups corresponding to the first rows R1 and the second rows R2 may be arranged in the cell region 50 along the second direction. Each cell string group includes first to fourth cell strings S1 to S4. The first column pitch 270b may be identical to or less than a length 265 in the second direction of the two cell string groups (i.e., eight cell strings).

In the above-described embodiments, a semiconductor device where three driving transistors or four driving transistors are electrically connected to each of the nodes N1 to Nm is described. However, the present invention is not limited thereto. More than five driving transistors may be electrically connected to each of the nodes N1 to Nm. Accordingly, more than five driving transistors are formed in one driving active region, and may share one common source/drain in the driving active region.

The above-described embodiments disclose NAND type nonvolatile memory devices according to the present invention. However, the present invention is not limited thereto. For example, the semiconductor device according to the present invention may have another form of a semiconductor device including a driving active region and at least three driving transistors in the driving active region. Additionally, the driving active region and at least three driving transistors formed in the driving active region may be applied to another driving circuit region other than the decoder circuit region.

The semiconductor device according to the embodiments of the present invention may be included in an electronic system. The electronic system will be described with reference to the accompanying drawings.

Figure 19:
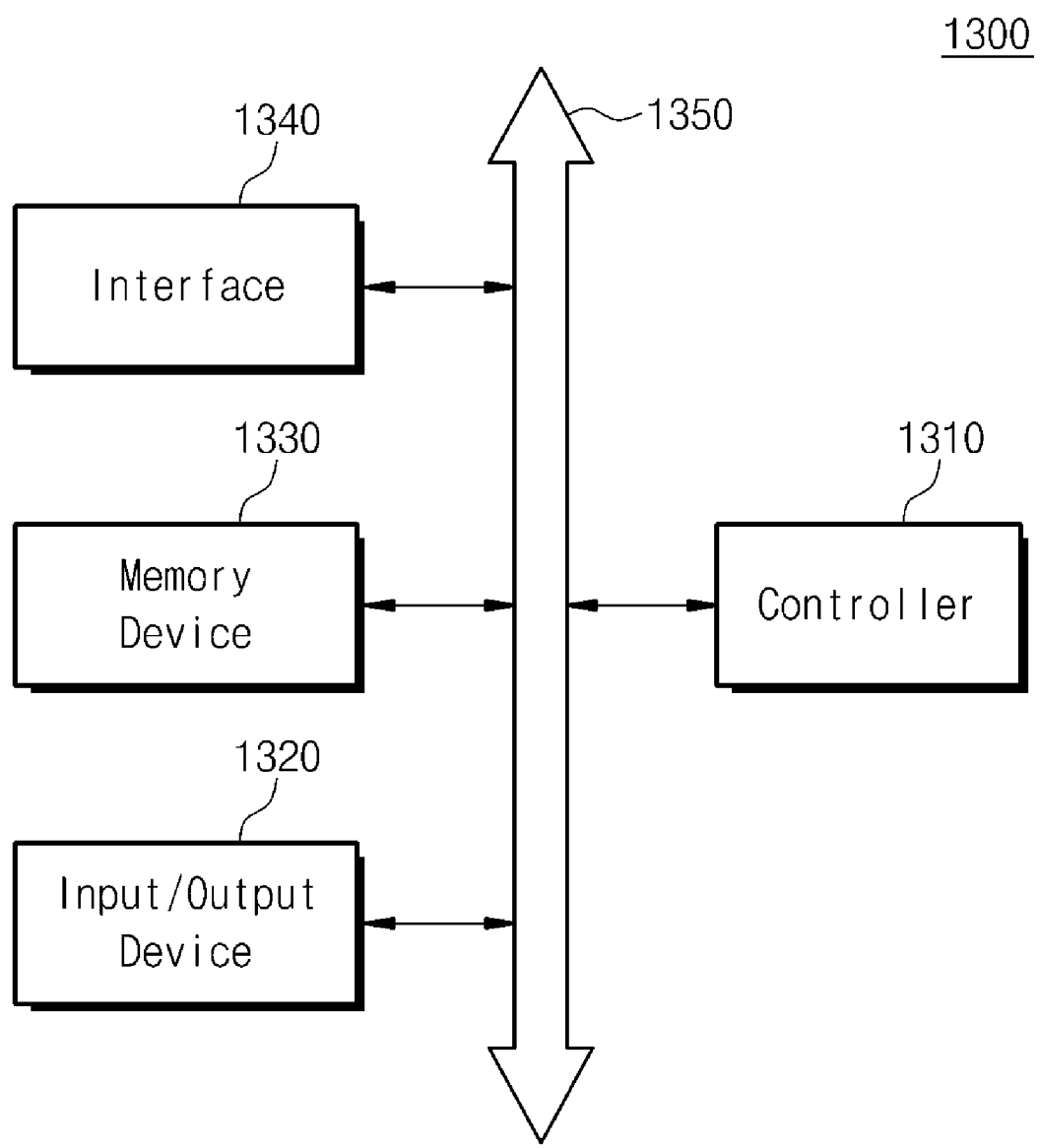
FIG. 19 is a block diagram illustrating an electron system that includes a semiconductor device according to embodiments of the present invention.

FIG. 19 is a block diagram illustrating an electronic system that includes a semiconductor device according to embodiments of the present invention.

Referring to FIG. 19, the electronic system 1300 may include a controller 1310, an input/output device 1320, and a memory device 1330. The controller 1310, the input/output device 1320, and the memory device 1330 may be connected to each other by a bus 1350. The bus 1350 may correspond to a path through which data and/or actual signals transfer. The controller 1310 may include at least one of a microprocessor, a digital signal processor, and a microcontroller, or at least one of logic devices for performing their similar functions. The input/output device 1320 may include at least one of a keypad, a keyboard, and a display device. The memory device 1330 may store data and/or commands executed by the controller 1310. The memory device 1330 may include at least one of the semiconductor devices according to the first and second embodiments. The electronic system 1300 may further include an interface 1340 for transmitting data via a communication network or receiving data from a communication network. The interface 1340 may be wired or wireless. For example, the interface 1340 may include an antenna or a wired/wireless transceiver.

The electronic system 1300 may be realized with a mobile system, a personal computer, an industrial computer or a system for performing various functions. For example, the mobile system may be a personal digital assistant (PDA), a portable computer, a web tablet, a mobile phone, a wireless phone, a laptop computer, a memory card, a digital music system, or an information transmitting/receiving system. If the electronic system 1300 is a device for wireless communication, it may be used as a communication interface protocol of a third generation communication system such as code division multiple access (CDMA), global system for mobile communication (GSM), North American digital cellular (NADC), E-time division multiple access (TDMA), wideband code division multiple access (WCDMA), and CDMA2000.

The semiconductor device according to the embodiments of the present invention may be included in a memory card. This will be described with reference to the accompanying drawings.

Figure 20:
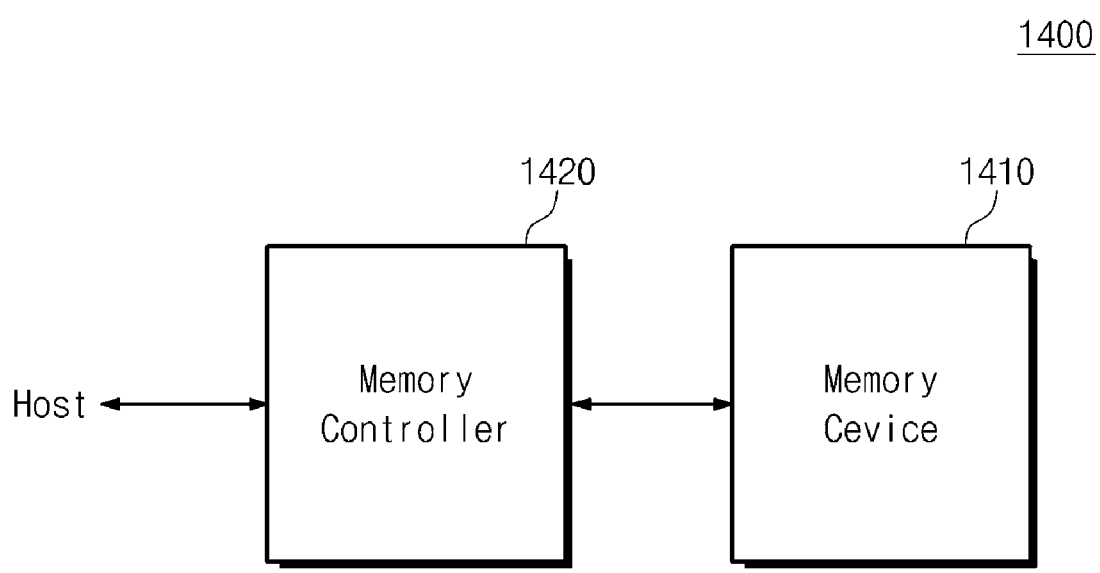
FIG. 20 is a block diagram illustrating a memory card with a semiconductor device according to the embodiments of the present invention.

FIG. 20 is a block diagram illustrating a memory card with a semiconductor device according to the embodiments of the present invention.

Referring to FIG. 20, the memory card 1400 includes a memory device 1410 and a memory controller 1420. The memory device 1410 stores data. The memory device 1410 may have non-volatile characteristics to retain stored data even if there is no power supply. The memory device 1410 may include at least one of the semiconductor devices of the first and second embodiments. The memory controller 1420 reads stored data from or stores data in the memory device 1410 in response to a read/write request of a host According to the above-described semiconductor device, at least three driving transistors are formed in a driving active region and share one common source/drain. Accordingly, an area that one driving transistor occupies in the semiconductor device can be reduced. As a result, the highly integrated semiconductor device can be realized. Since the driving transistor controls a high voltage, it may have a large size. Therefore, by reducing the size of the driving transistor, the semiconductor device can be effectively highly integrated.

The above-described subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A semiconductor device comprising:
a driving active region defined in a substrate; and
at least three driving transistors disposed at the driving active region,
wherein the at least three driving transistors share one common source/drain;
the at least three driving transistors include at least three individual source/drains, respectively;
the at least three individual source/drains are independent from each other; and
the common source/drain and the at least three individual source/drains are disposed in the driving active region.

2. The semiconductor device according to claim 1, wherein the driving active region comprises a common portion and at least three branch portions, the branch portions extending from the common portion and being spaced apart from each other;
the common source/drain is disposed in at least the common portion;
the individual source/drain are disposed in the branch portions, respectively; and
each driving transistor includes a driving gate pattern being disposed on the branch portion between the individual source/drain and the common source/drain.

3. The semiconductor device according to claim 1, further comprising at least three cell strings corresponding to the at least three driving transistors, respectively, wherein each of the cell strings including a first selection gate line, a plurality of cell gate lines, and a second selection gate line; and one of the first selection gate line, the plurality of cell gate lines, and the second selection gate line in each of the cell strings is electrically connected to each of the individual source/drains.

4. The semiconductor device according to claim 1, wherein the driving transistors control a driving voltage higher than a supply voltage.

5. A semiconductor device comprising:
a driving active region defined in a substrate, the driving active region including a common portion and a first branch portion, a second branch portion, and a third branch portion, the first to third branch portions extending from the common portion and being spaced apart from each other;
a first driving gate pattern, a second driving gate pattern, and a third driving gate pattern crossing over the first branch portion, the second branch portion and the third branch portion, respectively;
a common source/drain disposed in at least the common portion; and
a first individual source/drain, a second individual source/drain and a third individual source/drain disposed in the first, second and third branch portions at one side of the first, second and third driving gate patterns, respectively, the first to third individual source/drains being spaced apart from each other.

6. The semiconductor device of claim 5, further comprising a first cell string, a second cell string, and a third cell string disposed in a cell region of the substrate,
wherein the first cell string includes a gate line that is electrically connected to the first individual source/drain;
the second cell string includes a gate line that is electrically connected to the second individual source/drain; and
the third cell string includes a gate line that is electrically connected to the third individual source/drain.

7. The semiconductor device of claim 6, wherein each of the first to third cell strings comprises a first selection line, a plurality of cell gate lines, and a second selection gate line; and
the gate lines that are electrically connected to the first to third individual source/drains have the same type.

8. The semiconductor device of claim 5, wherein the first branch portion, the common portion, and the third branch portion are sequentially arranged along a first direction; and
the common portion and the second branch portion are sequentially arranged along a second direction perpendicular to the first direction.

9. The semiconductor device of claim 5, further comprising:
a first landing conductive pattern disposed on the first individual source/drain and parallel to the first driving gate pattern;
a second landing conductive pattern disposed on the second individual source/drain and parallel to the second driving gate pattern;
a third landing conductive pattern disposed on the third individual source/drain and parallel to the third driving gate pattern; and
a common landing conductive pattern disposed on the common source/drain.

10. The semiconductor device of claim 5, further comprising:
a first interconnection line, a second interconnection line, and a third interconnection line electrically connected to the first, second and third individual source/drains, respectively; and
a driving line electrically connected to the common source/drain.

11. The semiconductor device of claim 5, wherein:
the driving active region includes a fourth branch portion extending from the common portion and being spaced apart from the first to third branch portions; and
the semiconductor device further comprises:
a fourth driving gate pattern crossing over the fourth branch portion; and
a fourth individual source/drain disposed in the fourth branch portion at one side of the fourth driving gate pattern and spaced apart from the first to third individual source/drains.

12. The semiconductor device of claim 11, wherein:
the first branch portion, the common portion, and the third branch portion are sequentially arranged along a first direction; and
the second branch portion, the common portion, and the fourth branch portion are sequentially arranged along a second direction perpendicular to the first direction.

13. The semiconductor device of claim 11, further comprising:
a first cell string, a second cell string, a third cell string, and a fourth cell string, disposed in a cell region of the substrate,
wherein the first cell string includes a gate line that is electrically connected to the first individual source/drain;
the second cell string includes a gate line that is electrically connected to the second individual source/drain;
the third cell string includes a gate line that is electrically connected to the third individual source/drain; and
the fourth cell string includes a gate line that is electrically connected to the fourth individual source/drain.

14. The semiconductor device of claim 5, wherein a driving voltage higher than a supply voltage is supplied to the common source/drain.

15. A semiconductor device comprising:
a plurality of driving active regions arranged two-dimensionally in a driving circuit region of a substrate, each of the driving active regions including a common portion and a first branch portion, a second branch portion, and a third branch portion, the first to third branch portions extending from the common portion;
a first driving gate pattern, a second driving gate pattern, and a third driving gate pattern disposed on each of the driving active regions, the first, second and third driving gate patterns crossing over the first, second and third branch portions, respectively;
a first individual source/drain, a second individual source/drain, and a third source/drain disposed in each of the driving active regions, the first, second and third individual source/drains being respectively disposed in the first, second and third branch portions at one side of the first to third driving gate patterns and being spaced apart from each other; and
a common source/drain disposed in each of the driving active regions, the common source/drain being disposed at least in the common portion.

16. The semiconductor device of claim 15, further comprising a first cell string, a second cell string, and a third cell string disposed in a cell region of the substrate, wherein the driving active regions form a plurality of rows;
a first selection gate line, a plurality of cell gate lines, and a second selection gate line of the first cell string are electrically connected to the first individual source/drains in one of the rows, respectively;
a first selection gate line, a plurality of cell gate lines, and a second selection gate line of the second cell string are electrically connected to the second individual source/drains in the one row, respectively; and
a first selection gate line, a plurality of cell gate lines, and a second selection gate line of the third cell string are electrically connected to the third individual source/drains in the one row, respectively.

17. The semiconductor device of claim 15, wherein the driving active regions comprise:

first driving active regions constituting a plurality of first rows and a plurality of first columns; and
second driving active regions constituting a plurality of second rows and a plurality of second columns,
wherein the first columns and the second columns are alternately arranged in a first direction and the first rows and the second rows are alternately arranged in a second direction perpendicular to the first direction.

18. The semiconductor device of claim 17, wherein:

the first branch portion, common portion, and third branch portion of each of the first driving active regions are arranged along the first direction;
the first branch portion, common portion, and third branch portion of each of the second driving active regions are arranged along the first direction;
the second branch portion of each of the first driving active regions extends toward the second row and the second branch portion of each of the second driving active regions extends toward the first row, in the first row and second row adjacent to each other; and
the first direction is a longitudinal direction of a gate line in a cell region of the substrate.

19. The semiconductor device of claim 18, wherein the second branch portions of the first row and the second branch portions of the second row, in the first row and second row adjacent to each other, overlap in the first direction.

20. The semiconductor device of claim 17, wherein the first branch portion, common portion, and third branch portion of each of the first driving active regions are arranged along the second direction;

the first branch portion, common portion, and third branch portion of each of the second driving active regions are arranged along the second direction;
the second branch portion of each of the first driving active regions extends toward the second column and the second branch portion of each of the second driving active regions extends toward the first column, in the first column and second column adjacent to each other; and
the first direction is a longitudinal direction of a gate line in a cell region of the substrate.

21. The semiconductor device of claim 20, wherein the second branch portions of the first column and the second branch portions of the second column, in the first column and second column adjacent to each other, overlap in the second direction.

22. The semiconductor device of claim 17, wherein the common source/drains in the first column and second column adjacent to each other are electrically connected to one driving line.

23. The semiconductor device of claim 15, wherein each of the driving active regions further comprises a fourth branch portion extending from the common portion; and the semiconductor device further comprises:
a fourth driving gate pattern disposed on each of the driving active regions to cross over the fourth branch portion; and
a fourth individual source/drain disposed in the fourth branch portion at one side of the fourth driving gate pattern in each of the driving active regions.

24. The semiconductor device of claim 23, further comprising a first cell string, a second cell string, a third cell string, and a fourth cell string, disposed in a cell region of the substrate, wherein the driving active regions form a plurality of rows;
a first selection gate line, a plurality of cell gate lines, and a second selection gate line of the first cell string are electrically connected to the first individual source/drains in one of the rows, respectively;
a first selection gate line, a plurality of cell gate lines, and a second selection gate line of the second cell string are electrically connected to the second individual source/drains in the one row, respectively;
a first selection gate line, a plurality of cell gate lines, and a second selection gate line of the third cell string are electrically connected to the third individual source/drains in the one row, respectively; and
a first selection gate line, a plurality of cell gate lines, and a second selection gate line of the fourth cell string are electrically connected to the fourth individual source/drains in the one row, respectively.

25. The semiconductor device of claim 23, wherein the first branch portion, the common portion, and the third branch portion are arranged along a first direction, and the second branch portion, the common portion, and the fourth branch portion are arranged along a second direction perpendicular to the first direction, in each of the driving active regions.

* * * * *